(12) United States Patent
Shoji et al.

(10) Patent No.: US 7,723,984 B2
(45) Date of Patent: May 25, 2010

(54) MAGNETIC SENSOR AND CURRENT SENSOR

(75) Inventors: Shigeru Shoji, Tokyo (JP); Masato Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 816 days.

(21) Appl. No.: 11/526,747

(22) Filed: Sep. 26, 2006

(65) Prior Publication Data
US 2007/0076332 A1 Apr. 5, 2007

(30) Foreign Application Priority Data
Sep. 30, 2005 (JP) .............................. 2005-288822

(51) Int. Cl.
G01R 33/09 (2006.01)
G01R 33/02 (2006.01)
(52) U.S. Cl. ..................... 324/252; 324/249; 327/510
(58) Field of Classification Search ............ 324/207.21, 324/252, 249; 327/510–511; 257/421–427
See application file for complete search history.

(56) References Cited
U.S. PATENT DOCUMENTS
4,749,939 A 6/1988 Seitz

2002/0036497 A1* 3/2002 Inage et al. ................. 324/252

FOREIGN PATENT DOCUMENTS

| JP | A 60-001515 | 1/1985 |
| JP | A 05-322934 | 12/1993 |
| JP | B2 7-123090 | 12/1995 |
| JP | A 08-226960 | 9/1996 |
| JP | A 10-256620 | 9/1998 |
| JP | A 2004-029007 | 1/2004 |
| JP | A 2004-288666 | 10/2004 |
| JP | A 2005-236134 | 9/2005 |

* cited by examiner

Primary Examiner—Bot L LeDynh
(74) Attorney, Agent, or Firm—Oliff & Berridge, PLC

(57) ABSTRACT

The present invention provides a current sensor of smaller and simpler configuration, capable of measuring a current to be detected with high precision and stability. A magnetic sensor includes: an element substrate including a magnetoresistive element, the magnetoresistive element having a pinned layer with a magnetization pinned to a direction, an intermediate layer, and a free layer whose magnetization direction changes according to an external magnetic field; and a magnetic sheet attached on one side of the element substrate so as to apply a bias magnetic field to the magnetoresistive element.

6 Claims, 15 Drawing Sheets

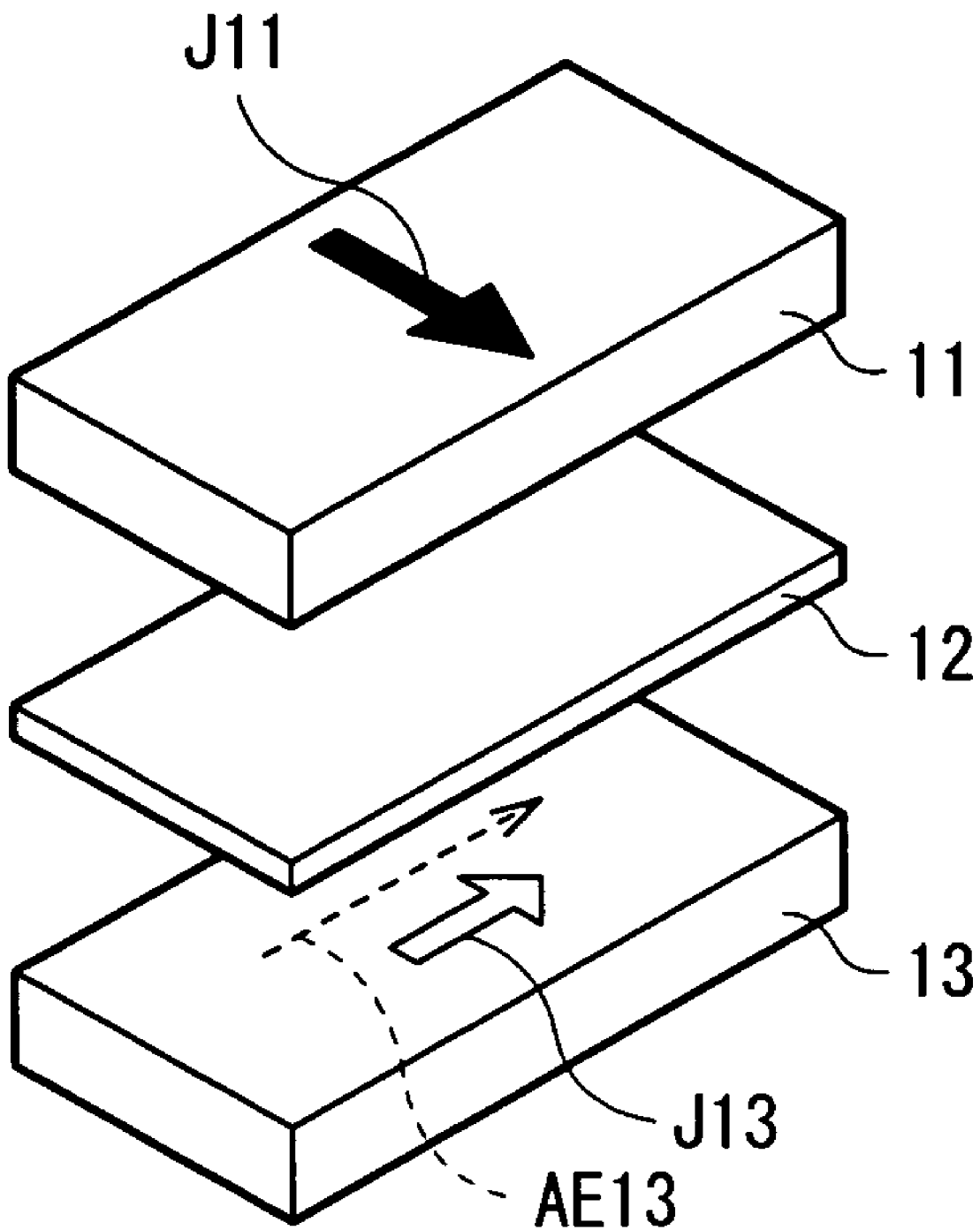
F I G. 3

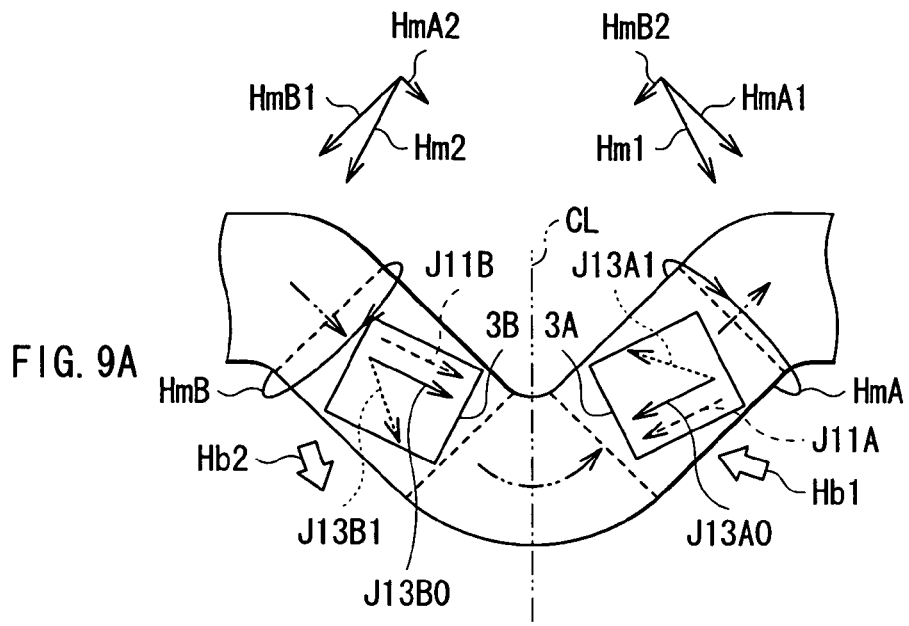
FIG. 9A
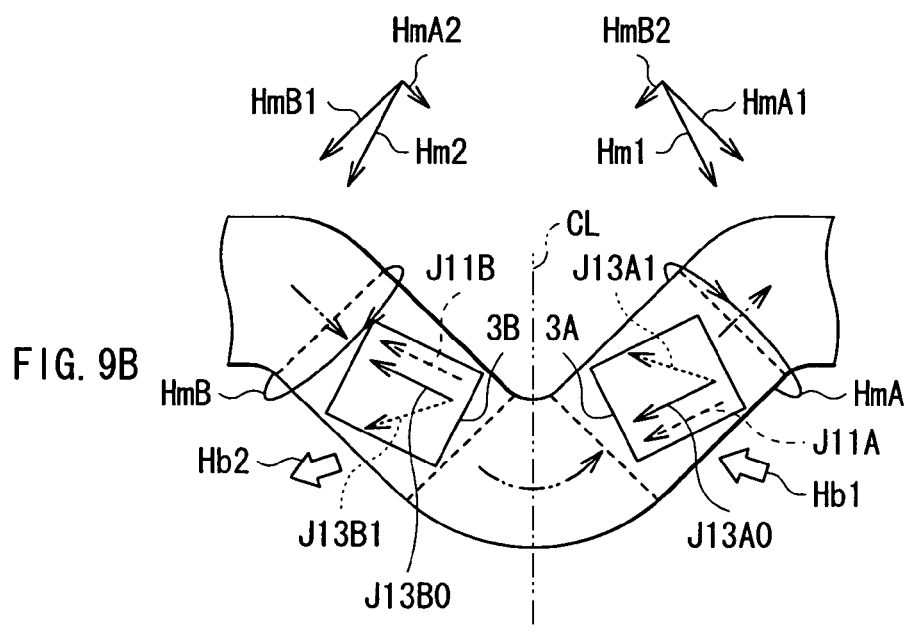
FIG. 9B
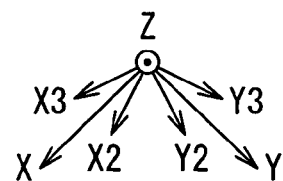

MAGNETIC SENSOR AND CURRENT SENSOR

BACKGROUND OF THE INVENTION

1. Field of the Invention

The present invention relates a magnetic sensor capable of detecting a variation of a magnetic field with high sensitivity, and a current sensor capable of detecting a variation of a current flowing through a conductor line with high sensitivity.

2. Description of the Related Art

In measuring correctly a control current which flows into a circuit of control equipment, a method where resistances are connected in series within the circuit to measure a voltage drop of the resistances is applied generally. In this case, however, a load different from the control system is given, and there is a possibility that an adverse influence may be exerted on the control system. Consequently, a method of indirectly measuring a control current by detecting the gradient of a current magnetic field generated by the control current has been used. Specifically, a control current is supplied to a U-shaped, curved conductor line, and variation of current magnetic fields produced around the curved conductor line is detected by use of a Hall device (for example, refer to Japanese Unexamined Patent Publication No.H07-123090).

However, the above-described current sensor has problems that a miniaturization is difficult and that the linearity of detection sensitivity to the change of magnetic field or high-frequency response are inadequate and so on. For this reason, a current sensor, in which a giant magnetoresistive element developing a Giant Magneto-Resistive effect (hereinafter referred to as GMR element) is arranged in a current magnetic field generated by the control current in order to detect its gradient instead of the Hall element, is proposed. That current sensor using such a GMR element can improve the detection sensitivity and high-frequency response, and what is more, a detection characteristic that is stabilized against a temperature change is obtainable.

SUMMARY OF THE INVENTION

In these days, a current sensor capable of conducting a more precise current measurement is strongly desired. Therefore, it is necessary to secure the linearity of a resistance change of the GMR elements to a variation of current magnetic fields more strictly and with more stably. On the other hand, a current sensor of much more compact whole configuration is also desired.

The present invention has been achieved in consideration of such problems, and it is desirable to provide a more miniaturized and simple current sensor capable of measuring a current to be detected with high precision and stability.

According to an embodiment of the present invention, there is provided a magnetic sensor including: an element substrate including a magnetoresistive element, the magnetoresistive element having a pinned layer with a magnetization direction pinned to a direction, an intermediate layer, and a free layer whose magnetization direction changes according to an external magnetic field; and a magnetic sheet attached on one side of the element substrate so as to apply a bias magnetic field to the magnetoresistive element. Here, the magnetic sheet may be attached on the side of substrate in the element substrate, or may be attached on the side opposite to the substrate. The attachment between the element substrate and the magnetic sheet may be direct, or may be indirect.

Since the magnetic sensor of an embodiment of the present invention is configured in such a way that the magnetic sheet is attached directly or indirectly onto the element substrate having a magnetoresistive element so that the magnetic sheet may apply a bias magnetic field to the magnetoresistive element, it is possible to reduce an influence of unnecessary turbulence magnetic fields applied from the outside. For this reason, the magnetoresistive element shows an accurate and stable resistance change which is excellent in linearity, based on a magnetic field to be detected. Moreover, the arrangement of the magnetic sheet can use a space in a more effective way, compared with a case where permanent magnets or coils are arranged on both sides of the magnetoresistive element.

According to an embodiment of the present invention, there is provided a first current sensor including: a conductor line generating a current magnetic field according to a supplied current to be detected; an element substrate including a magnetoresistive element disposed along with the conductor line so that a resistance value of the magnetoresistive element changes according to the current magnetic field; and a magnetic sheet attached on one side of the element substrate so as to apply a bias magnetic field to the magnetoresistive element.

According to an embodiment of the present invention, there is provided a second current sensor including: a conductor line generating a current magnetic field according to a supplied current to be detected; a pair of element substrates each including a magnetoresistive element disposed along with the conductor line; a pair of magnetic sheets each attached on one side of each of the element substrates, respectively, so as to apply a bias magnetic field to each of the magnetoresistive elements; a pair of constant current sources each supplying a constant current of a common magnitude to each of the magnetoresistive elements; and a difference detector detecting a difference in the voltage drops resulting from the constant current in each of the magnetoresistive elements. Here, the magnetoresistive elements are set so that a resistance value of one of the magnetoresistive elements changes in a direction opposite to that of resistance-value-change of the other magnetoresistive element according to the current magnetic field, and the current Im to be detected can be measured on the basis of the difference in the voltage drops.

According to an embodiment of the present invention, there is provided a third current sensor including: a conductor line generating a current magnetic field according to a supplied current to be detected; first through fourth element substrates disposed along with the conductor line, each of the element substrates including a magnetoresistive element whose resistance value changes according to the current magnetic field; and first through fourth magnetic sheets each attached on one side of each of the first through fourth element substrates, respectively, so as to apply a bias magnetic field to each of the magnetoresistive elements. Here, one end of the magnetoresistive element in the first element substrate and one end of the magnetoresistive element in the second element substrate are connected each other in a first junction point, one end of the magnetoresistive element in the third element substrate and one end of the magnetoresistive element in the fourth element substrate are connected each other in a second junction point, the other end of magnetoresistive element in the first element substrate and the other end of the magnetoresistive element in the fourth element substrate are connected each other in a third junction point, and the other end of magnetoresistive element in the second element substrate and the other end of the magnetoresistive element in the third element substrate are connected each other in a fourth junction point. As a result, a bridge circuit is formed.

In the first through third current sensors of an embodiment of the present invention, since the magnetic sheet (the first through fourth magnetic sheets) is attached directly or indirectly onto the element substrate (the first through fourth element substrates) including a magnetoresistive element disposed along with a conductor line used as the path of the current to be detected so that the magnetic sheet applies a bias magnetic field to the magnetoresistive element, it is possible to reduce an influence of unnecessary turbulence magnetic fields applied from the outside. For this reason, the magnetoresistive element shows an accurate and stable resistance change which is excellent in linearity, based on a magnetic field to be detected. Moreover, the arrangement of the magnetic sheet can use a space in a more effective way, compared with a case where permanent magnets or coils are arranged on both sides of the magnetoresistive element.

In the first through third current sensors of an embodiment of the present invention, the magnetoresistive element preferably includes in order: a pinned layer having a magnetization direction pinned to a direction; an intermediate layer; and a free layer whose magnetization direction changes according to an external magnetic field, while the magnetization direction under no external magnetic field is parallel or antiparallel to the direction in which the conductor line is extending. It is desirable that the magnetization direction of the pinned layer is orthogonal to or parallel to the magnetization direction of the free layer under no external magnetic field. In the mutually orthogonal case, it is preferable to apply a bias magnetic field in the same direction as the magnetization direction of the free layer under no external magnetic field by use of the magnetic sheet. On the other hand, in the mutually parallel case, it is preferable to apply a bias magnetic field having both a parallel component parallel to the magnetization direction of the pinned layer and a perpendicular component orthogonal to the parallel component by use of the magnetic sheet. Examples of the external magnetic field here include the current magnetic field generated by the current to be detected, the bias magnetic field applied by the magnetic sheet or any external noise.

In the third current sensor of an embodiment of the present invention, it is preferable to have further a difference detector detecting a potential difference between the third junction point and the fourth junction point when voltage is applied between the first junction point and the second junction point. In addition, preferably, resistance values of the magnetoresistive elements in the first and third element substrates change in the same direction according to the current magnetic fields, while resistance values of the magnetoresistive elements in the second and fourth element substrates change in the direction opposite to that of resistance-value-change of the magnetoresistive elements in the first and third element substrates according to the current magnetic fields.

According to an embodiment of the present invention, there is provided a method of manufacturing a magnetic sensor including the steps of forming a laminated product by applying adhesives to the back of a substrate and sticking a magnetic sheet on the back, the substrate being provided with a plurality of magnetoresistive elements formed on the front surface thereof; setting a magnetization direction of the magnetic sheet; and cutting the laminated product to divide into pieces so that each piece includes a magnetoresistive element.

According to the method of manufacturing the magnetic sensor of an embodiment of the present invention, the magnetic sheet is stuck on the back of the substrate provided with a plurality of magnetoresistive elements are formed, then a magnetization direction of the magnetic sheet is set and after that, the laminated product is cut to divide into pieces so that each piece includes a magnetoresistive element. In this manner, a plurality of magnetic sensors having a magnetoresistive element to which a bias magnetic field is applied in a direction can be formed at a time in a simple and easy way.

In the method of manufacturing the magnetic sensor of an embodiment of the present invention, it is preferable to further includes a step of grinding the back of the substrate into a predetermined thickness, after forming a plurality of magnetoresistive elements thereon and before sticking the magnetic sheet thereto.

In the method of manufacturing the magnetic sensor of an embodiment of the present invention, it is preferable to further includes a step of grinding the magnetic sheet to adjust strength of a bias magnetic field applied from the magnetic sheet to the magnetoresistive elements.

According to the magnetic sensor of an embodiment of the present invention, since an element substrate having a magnetoresistive element and a magnetic sheet are unified by bonding together directly or indirectly so that the magnetic sheet can apply a bias magnetic field to the magnetoresistive element, there is an effect that an influence of unnecessary turbulence magnetic fields from the outside can be fully avoided while a magnetic field to be detected can be detected with precision and stability. Moreover, the whole configuration can be made smaller and more simple using a space effectively, compared with a case where permanent magnets or coils are arranged on both sides of the magnetoresistive element for applying a bias magnetic field.

According to the first through third current sensors of an embodiment of the present invention, an element substrate (a first through fourth element substrates) having a magnetoresistive element and a magnetic sheet (a first through fourth magnetic sheets) are unified by bonding together and are disposed along with a conductor line that is used as the path of a current to be detected, so that the magnetic sheet can apply a bias magnetic field to the magnetoresistive element. In this manner, there is an effect that an influence of unnecessary turbulence magnetic fields from the outside can be fully avoided while a current magnetic field generated on the basis of a current to be detected can be detected with precision and stability. Moreover, the whole configuration can be made smaller and more simple using a space effectively, compared with a case where permanent magnets or coils are arranged on both sides of the magnetoresistive element for applying a bias magnetic field. Therefore, there is an effect of being able to attain a miniaturization while capable of measuring the current to be detected with high precision and stability.

According to the method of manufacturing the magnetic sensor of an embodiment of the present invention, after grinding the back of a substrate provided with a plurality of magnetoresistive elements are formed, a magnetic sheet is stuck on the back of the substrate, then a magnetization direction of the magnetic sheet is set and after that, the laminated product is cut to divide into pieces so that each piece includes a magnetoresistive element. In this manner, there is an effect that a plurality of magnetic sensors having a magnetoresistive element to which a bias magnetic field is applied in a direction can be formed at a time and in a simple and easy way.

Other and further objects, features and advantages of the invention will appear more fully from the following description.

BRIEF DESCRIPTION OF THE DRAWINGS

FIG. 3 is an exploded perspective view showing the configuration of a magnetoresistive element that is the principal part of the current sensor appearing in FIG. 1.

FIGS. 9A and 9B are conceptual diagrams for explaining a state of magnetization directions, current magnetic fields and bias magnetic fields in a modification of the current sensor appearing in FIG. 1.

DETAILED DESCRIPTION OF THE PREFERRED EMBODIMENTS

Embodiments of the present invention will be described in detail hereinbelow with reference to the drawings.

First Embodiment

Figure 1:
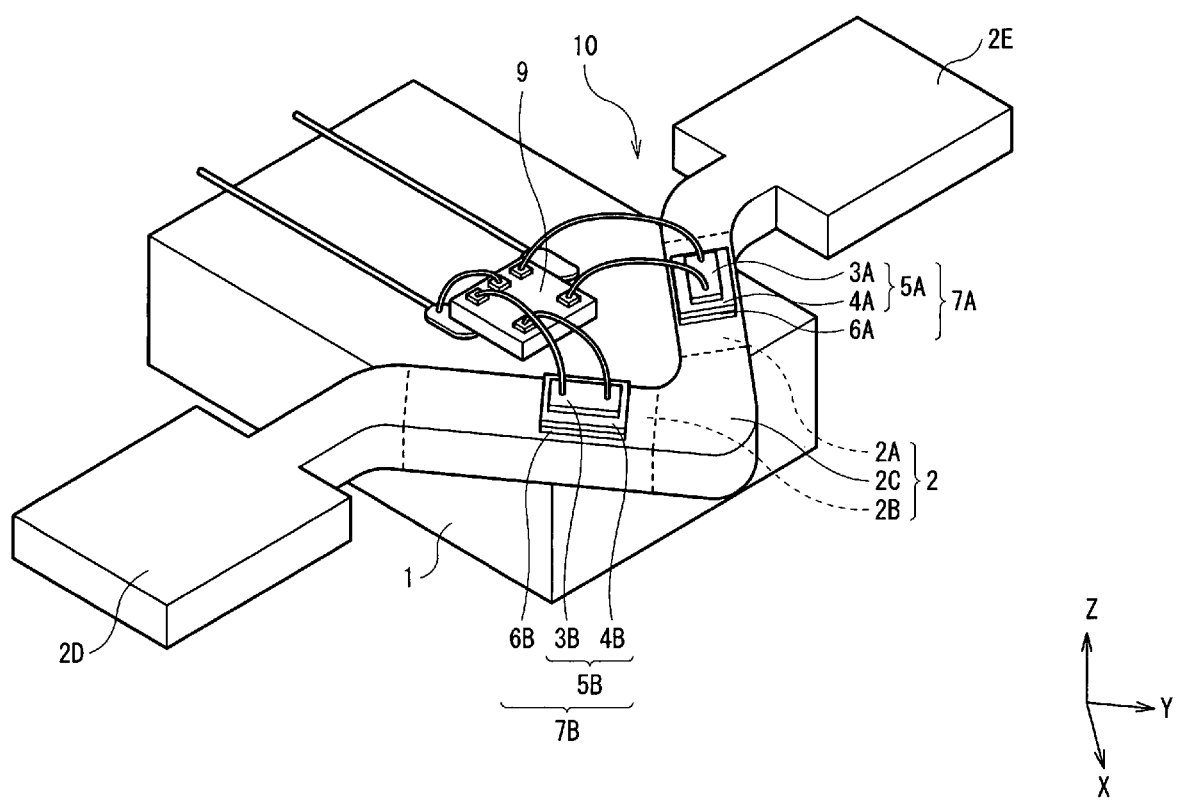
FIG. 1 is a perspective view showing a configuration of a current sensor according to a first embodiment of the present invention.
Figure 2:
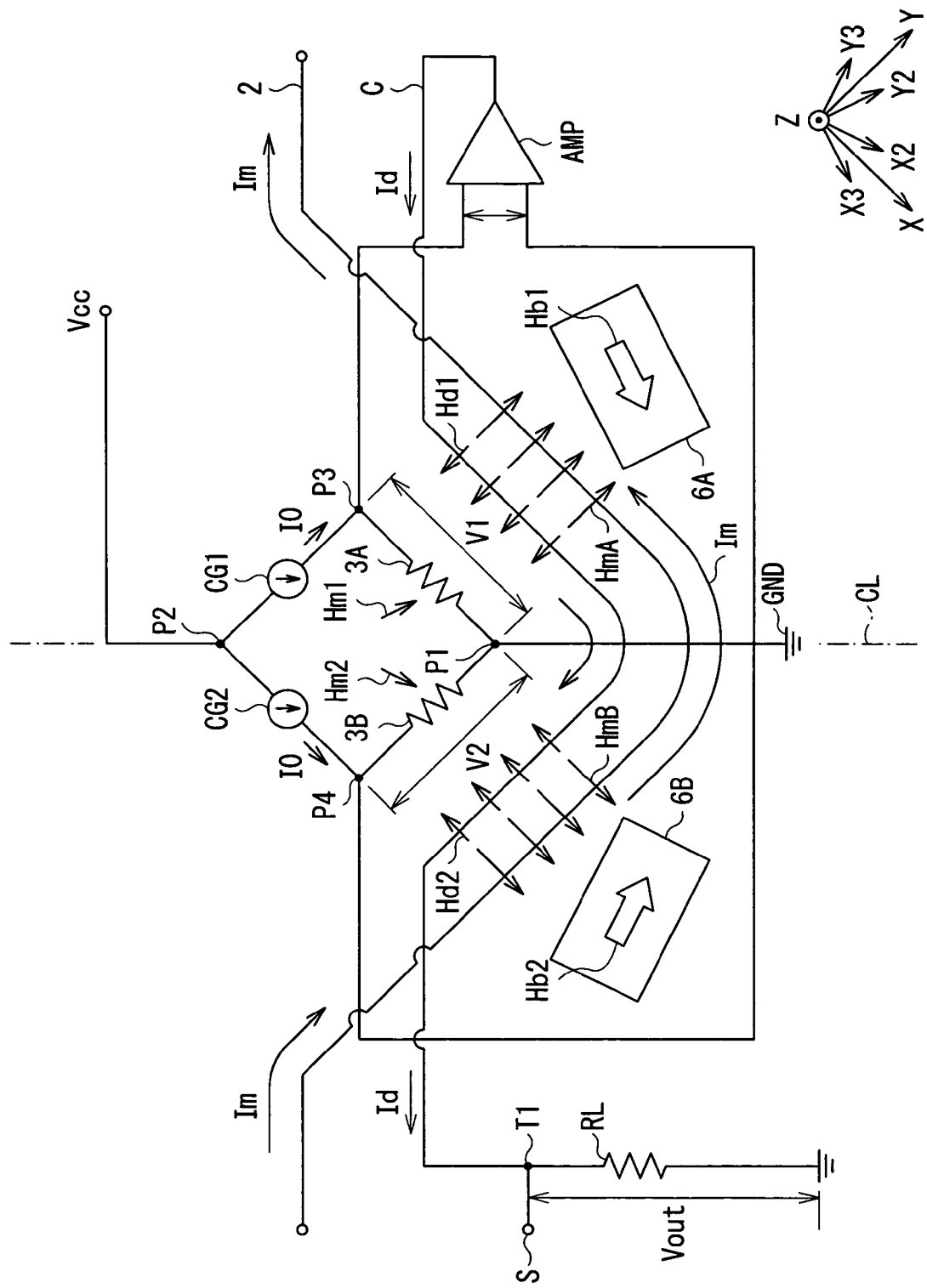
FIG. 2 is a circuit diagram corresponding to the current sensor appearing in FIG. 1.

First, a configuration of a current sensor according to a first embodiment of the present invention will be explained with reference to FIG. 1 and FIG. 2. FIG. 1 is a schematic diagram showing a perspective configuration of a current sensor 10 according to the present embodiment, and FIG. 2 expresses a circuit configuration of the current sensor 10 appearing in FIG. 1. Directions of all the arrows in FIG. 2 representing a current to be detected Im, a compensating current Id, current magnetic fields HmA and HmB, compensating current magnetic fields Hd, bias magnetic fields Hb1 and Hb2, and a current 10 indicate a relative direction with respect to a first and a second magnetoresistive elements 3A and 3B (which will be described later).

The current sensor 10 is an ammeter for measuring a current to be detected Im supplied to a conductor 2 formed on a substrate 1, and is provided with magnetic sensors 7A and 7B including a first and second magnetoresistive elements 3A and 3B (hereinafter just referred to as MR elements 3A and 3B). The MR elements 3A and 3B are connected each other at a first junction point P1, and arranged symmetrically with respect to a central line CL that passes along the midpoint on a virtual straight-line connecting the MR elements 3A and 3B each other (refer to FIG. 2).

The conductor 2 is a V-shaped configuration having a pair of straight-line portions 2A and 2B, and a folded portion 2C for connecting these straight-line portions. The ends of the conductor 2 are connected to pads 2D and 2E. The straight-line portions 2A and 2B are arranged axisymmetrically with respect to the central line CL (symmetry axis, refer to FIG. 2) in a plane parallel to the plane containing the MR elements 3A and 3B, and they are extending so as to make an angle of 45 degrees each other for example (that is, orthogonal to each other), in the x-axis direction and in the y-axis direction, respectively. On the straight-line portions 2A and 2B are provided the magnetic sensors 7A and 7B, respectively. Details of the magnetic sensors 7A and 7B will be described later.

As for the straight-line portions 2A and 2B, the areas of cross sections thereof orthogonal to the extending directions are uniform and equal to each other. Thereby, synthetic magnetic fields Hm1 and Hm2 of current magnetic field HmA and current magnetic field HmB generated when a current to be detected Im flows into the conductor 2 from the pad 2D toward the pad 2E, for example, are respectively applied to the MR elements 3A and 3B in the directions shown by arrows in FIG. 2. Here, the current magnetic field HmA is generated in the +Y direction in the straight-line portion 2A, and the current magnetic field HmB is generated in the +X direction in the straight-line portion 2B. Since the current magnetic fields HmA and HmB, although having different directions mutually, are generated by the same current to be detected Im and the areas of the cross sections of the straight-line portions 2A and 2B are equally uniformed mutually, the intensity (absolute value) of these current magnetic fields HmA and HmB are mutually equal. However, since the MR element 3A is arranged close to the straight-line portion 2A, the influence of the current magnetic fields HmB is smaller than the influence of the current magnetic fields HmA. For this reason, the direction of the synthetic magnetic field Hm1 applied to the MR element 3A is slightly tilted (rotated) from the +Y direction to the +X direction, that is, a Y2 direction. Similarly, since the MR element 3B is arranged close to the straight-line portion 2B, the influence of the current magnetic field HmA is small. For this reason, the direction of the synthetic magnetic field Hm2 applied to the MR element 3B is slightly tilted (rotated) from the +X direction to the +Y direction, that is, an X2 direction. Furthermore, the distance from the straight-line portion 2A to the MR element 3A and the distance from the straight-line portion 2B to the MR element 3B are mutually equal, while the distance from the straight-line portion 2A to the MR element 3B and the distance from the straight-line portion 2B to the MR element 3A are mutually equal. As a result of that, the intensity (absolute value) of the synthetic magnetic field Hm1 applied to the MR element 3A and the intensity (absolute value) of the synthetic magnetic field Hm2 applied to the MR element 3B are mutually equal. The MR elements 3A and 3B are formed so that each resistance R1 and R2 (which will be described later) can develop an opposite directional change each other by the existence of synthetic magnetic fields Hm1 and Hm2 when the current sensor 10 is driven.

The magnetic sensors 7A and 7B are stuck on the straight-line portions 2A and 2B with a 51 μm-10 μm thick adhesive layer (not shown) in between, respectively. More specifically, the magnetic sensors 7A and 7B are formed by laminating magnetic sheets 6A and 6B and element substrates 5A and 5B in order on the straight-line portions 2A and 2B, respectively, as appearing in FIG. 1. The adhesive layers of 5 μm-10 μm in thickness (not shown) are provided between the magnetic sheets 6A and 6B and the element substrates 5A and 5B, respectively. The element substrates 5A and 5B have a structure in which the MR elements 3A and 3B are provided on substrates 4A and 4B made of a silicon wafer of the order of 100 μm thick, respectively. The magnetic sheets 6A and 6B apply bias magnetic fields Hb1 and Hb2 (refer to FIG. 2) to the MR elements 3A and 3B, respectively. Here, the direction of the bias magnetic field Hb1 is an X3 direction (direction tilted slightly from the +X direction to the –Y direction) which intersects perpendicularly with the Y2 direction, and the direction of the bias magnetic field Hb2 is a Y3 direction (direction tilted slightly from the +Y direction to the –X direction) which intersects perpendicularly with the X2 direction. It is to be noted that the directions of the bias magnetic fields Hb1 and Hb2 are determined with reference to the magnetization directions of each pinned layer 13 (which will be described later) of the MR elements 3A and 3B besides with reference to the synthetic magnetic fields Hm1 and Hm2. The magnetic sheets 6A and 6B are made of a barium strontium ferrite [(Ba—Sr)Fe$_2$O$_4$], for example, and have a thickness of 75 μm-95 μm. It is to be noted that the material for the magnetic sheets 6A and 6B is not limited to that, but other ferromagnetic materials capable of becoming a permanent magnet can also be used. Preferably, the magnetic sheets 6A and 6B have a bigger area than the MR elements 3A and 3B so that application of the bias magnetic fields Hb1 and Hb2 can be stabilized.

The current sensor 10 further includes a constant current source CG1 (a first constant current source) and a constant current source CG2 (a second constant current source) the ends of which are connected each other in a second junction point P2 (FIG. 2). The constant current source CG1 is connected to the MR element 3A in a third junction point P3 by one end opposite to the first junction point P1, and the constant current source CG2 is connected to the MR element 3B in a fourth junction point P4 by one end opposite to the first junction point P1. Namely, the MR element 3A and the constant current source CG1 are connected in series, and the MR element 3B and the constant current source CG2 are connected in series, while both of the series connections are then connected in parallel each other axisymmetrically with respect to the central line CL (symmetry axis). Here, the constant current source CG1 and the constant current source CG2 are formed so as to supply a constant current 10 of mutually equal value to the MR element 3A and the MR element 3B, respectively. It is to be noted that the constant current sources CG1 and CG2 are arranged in the inside of a circuit board 9 provided on the substrate 1 (not shown in FIG. 1).

The current sensor 10 is further provided with a compensating current line C. If voltage is applied between the first junction point P1 and the second junction point P2, a compensating current Id based on the potential difference between the third junction point P3 and the fourth junction point P4 will be supplied to the compensating current line C (FIG. 2). One end of the compensating current line C is connected to the output side of a differential amplifier AMP as a difference detector whose input side is connected to the third and fourth junction points P3 and P4, and the other end of the compensating current line C is grounded via a resistor RL. A compensating current detector S is connected to the resistor RL at a junction point T1 on the differential amplifier AMP side. Here, the compensating current line C is arranged so that compensating current magnetic fields Hd1 and Hd2, which are respectively opposite to the current magnetic fields Hm1 and Hm2, may be generated when the compensating current Id flows. Namely, the compensating current magnetic field Hd1 is generated in the –Y direction, while the compensating current magnetic field Hd2 is generated in the –X direction, consequently having an effect of canceling the current magnetic fields Hm1 and Hm2, respectively.

The MR elements 3A and 3B have a structure in which an insulating film, a GMR film developing Giant Magneto-Resistive effect, an insulating film, and a pad are laminated in order on the substrates 4A and 4B, respectively. Here, the insulating films are made of aluminum oxide (Al$_2$O$_3$) etc., for example. The pad is an electrode for supplying a sense current in reading a resistance change of the GMR film. The GMR film will be explained in more detail with reference to FIG. 3. FIG. 3 is an exploded perspective view disassembling and showing the configuration of the GMR film which is included in each of the MR elements 3A and 3B.

As shown in FIG. 3, the GMR film in each of the MR elements 3A and 3B has a spin valve structure in which a plurality of function films including magnetic layers are laminated. Specifically, the GMR film includes: a pinned layer 11 having a magnetization direction J11 which is pinned to a certain direction; an intermediate layer 12 exhibiting no specific magnetization directions; and a free layer 13 having a magnetization direction J13 whose direction changes according to external magnetic fields H such as the synthetic magnetic fields Hm1 and Hm2, in order. It is to be noted that FIG. 3 shows an unloaded condition (namely, the state that no external magnetic field H is applied) in which the synthetic magnetic fields Hm1 and Hm2 are zero (Hm1, Hm2=0), and the bias magnetic fields Hb1 and Hb2 generated by the magnetic sheets 6A, 6B are not applied. In this case, the magnetization direction J13 of the free layer 13 are in parallel with its own easy magnetization direction AE13, while it is orthogonal to the magnetization direction J11 of the pinned layer 11.

The free layer 13 is made of a soft magnetic material such as nickel iron alloy (NiFe). The intermediate layer 12 is made of copper (Cu), its top face being in contact with the pinned layer 11, its under face being in contact with the free layer 13. The intermediate layer 12 may be made of, besides copper, a nonmagnetic metal having high conductivity such as gold (Au). The top face of the pinned layer 11 (the face on the side opposite to the intermediate layer 12) and the under face of the free layer 13 (the face on the side opposite to the intermediate layer 12) are protected with a protection film (not shown), respectively. An exchange bias magnetic field Hin in the magnetization direction J11 is generated between the pinned layer 11 and the free layer 13, working on each other with the intermediate layer 12 in between. The intensity of the exchange bias magnetic field Hin changes as the spin direction in the free layer 13 rotates according to the interval between the pinned layer 11 and the free layer 13 (that is, the thickness of the intermediate layer 12). Although FIG. 3 shows one example of configuration in which the free layer 13, the intermediate layer 12, and the pinned layer 11 are laminated in order from bottom up, it is not limited to the configuration but may be made in such a way as laminating in the opposite order.

In the GMR film of the MR elements 3A and 3B having the foregoing structure, the magnetization direction J13 of the free layer 13 rotates by applying the synthetic magnetic fields Hm1 and Hm2, and consequently the relative angle of the magnetization direction J13 and the magnetization direction J11 changes. The relative angle is decided by the magnitudes and directions of the synthetic magnetic fields Hm1 and Hm2.

Figure 4A:
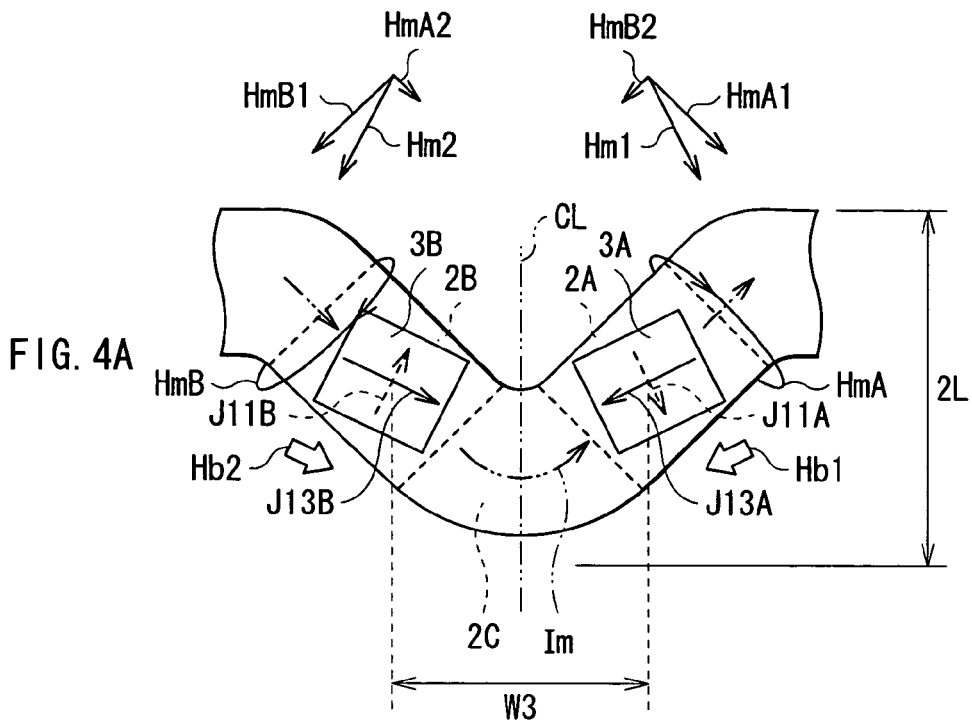
FIGS. 4A and 4B are conceptual diagrams for explaining a state of magnetization directions, current magnetic fields and bias magnetic fields in the current sensor appearing in FIG. 1.
Figure 4B:
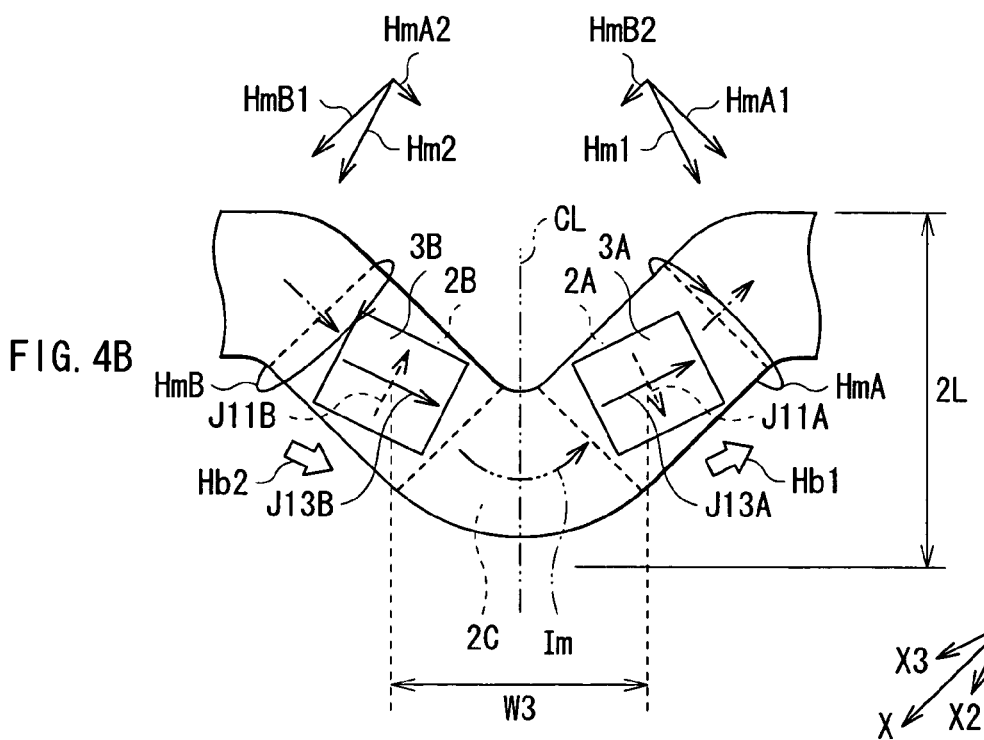

A relation among the magnetization directions J11 and J13 of the GMR films, the bias magnetic fields Hb1 and Hb2, and the synthetic magnetic fields Hm1 and Hm2 will be explained herein with reference to FIGS. 4A and 4B. FIGS. 4A and 4B are conceptual diagrams indicating a relation among the current direction, the magnetic field direction, and the magnetization direction in the current sensor 10. For example, supposing a current to be detected Im flows along the extending direction of the conductor 2 as shown by arrows, a current magnetic field HmA is generated around the straight-line portion 2A, and a current magnetic field HmB is generated around the straight-line portion 2B. In this case, the synthetic magnetic field Hm1 applied to the MR element 3A is a resultant force between a magnetic field component HmA1 in the +Y direction caused by the current magnetic field HmA and a magnetic field component HmB2 in the +X direction caused by the current magnetic field HmB, as shown by vectors. On the other hand, the synthetic magnetic field Hm2 applied to the MR element 3B is a resultant force between a magnetic field component HmA2 in the +Y direction caused by the current magnetic field HmA and a magnetic field component HmB1 in the +X direction caused by the current magnetic field HmB, as shown by vectors. Here, in the MR elements 3A and 3B, the magnetization directions J11A and J11B of the pinned layers 11 are pinned in the direction parallel or antiparallel with the synthetic magnetic fields Hm1 and Hm2, respectively. When no external magnetic field H is applied, magnetization directions J13A and J13B of the free layers 13 are in a state orthogonal to the synthetic magnetic fields Hm1 and Hm2, respectively. Namely, when no external magnetic field H is applied, the magnetization directions J13A and J13B are in a state orthogonal to the magnetization directions J11A and J13B, respectively. Therefore, when the current to be detected Im is supplied to the conductor 2 and the synthetic magnetic fields Hm1 and Hm2 are generated consequently, the magnetization directions J13A and J13B are coming to be in parallel (low resistance), or antiparallel (high resistance) to the magnetization directions J11A and J11B, more and more. The MR element 3A and the MR element 3B are set so that their own resistances R1 and R2 may changes oppositely each other according to the synthetic magnetic fields Hm1 and Hm2. Specifically, as shown in FIG. 4A, in the MR element 3A, the magnetization direction J11A is in the +Y2 direction while the magnetization direction J13A under no external magnetic field H is in the +X3 direction, for example. On the other hand, in the MR element 3B, the magnetization direction J11B is in the −X2 direction while the magnetization direction J13B under no external magnetic field H is in the +Y3 direction. In this case, when the current to be detected Im flows in the direction of the arrow to generate the synthetic magnetic fields Hm1 and Hm2, the magnetization direction J13A rotates counterclockwise (on the drawing sheet) to come to be in parallel with the magnetization direction J11A while the magnetization direction J13B rotates clockwise (on the drawing sheet) to come to be in antiparallel with the magnetization direction J11B. As a result, the resistance R1 of the MR element 3A decreases, and the resistance R2 of the MR element 3B increases. Or it is also possible that, as shown in FIG. 4B, in the MR element 3A, the magnetization direction J11A is set in the +Y2 direction and the magnetization direction J13A under no external magnetic fields H is set in the −X3 direction, while in the MR element 3B, the magnetization direction J11B is set in the −X2 direction and the magnetization direction J13B in the case the external magnetic field H are zero is set in the +Y3 direction. In this case, when the current to be detected Im flows in the direction indicated by the arrow to generate the synthetic magnetic fields Hm1 and Hm2, the magnetization direction J13A rotates clockwise to come to be in parallel with the magnetization direction J11A, while the magnetization directions J13B rotates clockwise to be in antiparallel with the magnetization direction J11B. As a result, the resistance R1 of the MR element 3A also decreases, and the resistance R2 of the MR element 3B also increases. Although, in both cases of FIGS. 4A and 4B, the resistance R1 of the MR element 3A decreases and the resistance R2 of the MR element 3B increases, it is not limited to that, and it is also possible that the resistance R1 may increase and the resistance R2 may decrease.

It is to be noted that in both of FIG. 4A and FIG. 4B, the magnetic sheets 6A and 6B are set so as to apply bias magnetic fields Hb1 and Hb2 having the same direction as the magnetization directions J13A and J13B in the case of no external magnetic field H. Therefore, the bias magnetic fields Hb1 and Hb2, which are corresponding to an anisotropic magnetic field, strengthen the uniaxial anisotropy of the free layer 13 to contribute to stabilization of the magnetic field detecting operation in the MR elements 3A and 3B. In related arts, shape anisotropy has been increased by way of developing the shape of the MR element itself long and slender, and further, a resistance change ratio has been raised by way of arranging two or more of the MR elements with a predetermined gap, respectively. In this manner, however, a comparatively big space is required and furthermore a compensating current line has to be enlarged. On the other hand, according to the current sensor 10 of the present embodiment, the flexibility of the shape of the MR elements 3A and 3B is high because shape anisotropy is not used, and there is no need of dividing each elements into two or more. As a result, a more compact configuration is realized.

Figure 21:
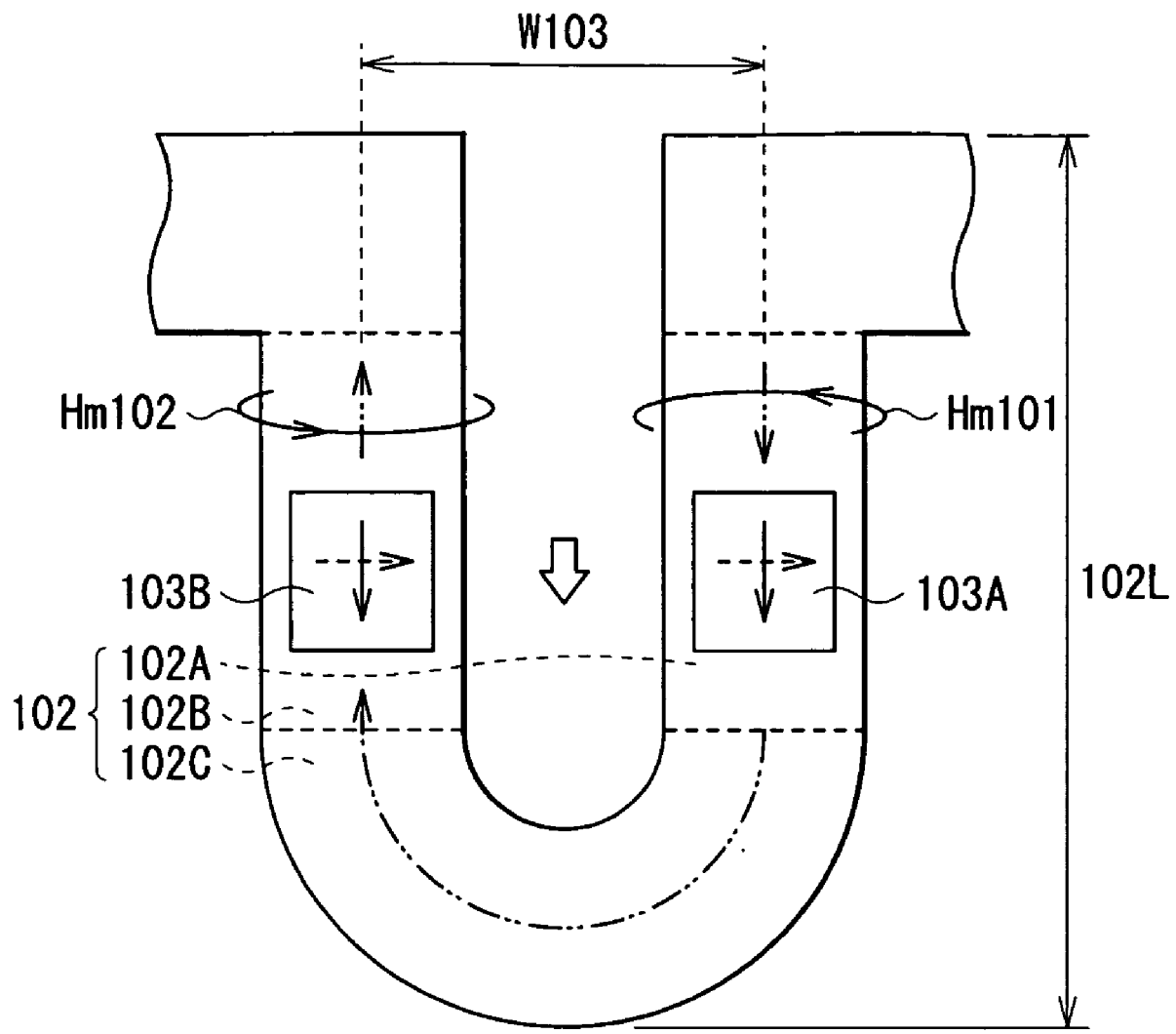
FIG. 21 is a schematic diagram showing a configuration of the conductor in a current sensor of related arts.

What is more, in the current sensor 10, the conductor 2 is formed of a V-shaped configuration including the straight-line portion 2A and the straight-line portion 2B which are orthogonal to each other. In this manner, compared with a current sensor of related arts in which a U-shaped conductor 102 including a pair of parallel straight-line portions 102A and 102B as shown in FIG. 21 is used, current measurement can be conducted more precisely, and what is more, miniaturization of the entire configuration can be realized. That is to say, in the case of the U-shaped conductor 102, an interaction occurs between a current magnetic field Hm101 and a current magnetic field Hm102 to cancel each other when the straight-line portion 102A and the straight-line portion 102B are disposed closer, since the flowing directions of the current to be detected Im are certainly made opposite between the straight-line portion 102A and the straight-line portion 102B. In order to reduce such an interaction, preferably, a gap W103 of the MR elements 103A and the 103B is kept beyond a certain distance. The conductor 102 further has a problem that the dimension of a folded portion 102C tends to become large. On the contrary, in the case of the current sensor 10 of the present embodiment, the directions of the current to be detected Im flowing through each of the straight-line portion 2A and the straight-line portion 2B are not completely reversed each other (in this case, an angle of 45 degrees exists). As a result, the interaction between the current magnetic field Hm1 produced from the straight-line portion 2A and the current magnetic field Hm2 produced from the straight-line portion 2B is relatively weak. For this reason, even when the gap W3 of the MR elements 3A and 3B is made small, the current magnetic fields Hm1 and Hm2 having a sufficient intensity for detecting operation can be applied to each of the MR elements 3A and 3B. Thereby, more precise current measurement becomes possible. Further, since the dimension for the folded portion 2C can also be made relatively small, height 2L of the whole conductor 2 can be made smaller than height 102L of the conductor 102. Namely, the current sensor 10 having a more compact whole configuration can be realized while maintaining the dimension of the MR elements 3A and 3B. Thereby, the measurement error caused by the difference in temperature between the MR elements 3A and 3B can also be reduced, and consequently more precise and stable current measurement is possible.

In the current sensor 10 having such a configuration, when voltage is applied between the first junction point P1 and the second junction point P2, a compensating current Id based on a potential difference V0 (difference in the voltage drops produced in each of the MR elements 3A and 3B) between the third junction point P3 and the fourth junction point P4 flows through the compensating current line C via the differential amplifier AMP (difference detector). The compensating current Id is detected by the compensating current detector S. The differential amplifier AMP has a function of adjusting the compensating current Id so that a value of the difference V0 becomes zero.

Hereafter, a method of measuring the current magnetic fields HmA and HmB generated by the current to be detected Im will be explained with reference to FIG. 2.

In FIG. 2, constant current from the constant current sources CG1 and CG2 at the time of applying a predetermined voltage between the first junction point P1 and the second junction point P2 is indicated as I0, and the resistances of the MR elements 3A and 3B are indicated as R1 and R2, respectively. When current magnetic fields HmA and HmB are not applied, potential V1 in the third junction point P3 is $V1=I0 \times R1$, and potential V2 in the fourth junction point P4 is set to $V2=I0 \times R2$. Therefore, the potential difference between the third junction point P3 and the fourth junction point P4 is $$V0 = V1 - V2 \quad (1)$$
$$= I0 \times R1 - I0 \times R2$$
$$= I0 \times (R1 - R2)$$

In this circuit, the amount of resistance change can be obtained by measuring the potential difference V0 when the current magnetic fields HmA and HmB are applied. For example, when the current magnetic fields HmA and HmB are applied, supposing that the resistance R1 and R2 respectively increase by variation amounts $\Delta R1$ and $\Delta R2$, Equation (1) is rewritten as follows:

$$V0 = V1 - V2 \quad (2)$$
$$= I0 \times (R1 - R2)$$
$$= I0 \times \{(R1 + \Delta R1) - (R2 + \Delta R2)\}$$

As already stated, since the MR elements 3A and 3B are arranged so that the resistances R1 and R2 show an opposite directional variation each other by the current magnetic fields HmA and HmB, the variation amounts $\Delta R1$ and $\Delta R2$ have an opposite positive/negative sign each other. Therefore, in Equation (2), R1 and R2 (resistance values before application of the current magnetic fields HmA and HmB) cancel out each other while the variation amounts $\Delta R1$ and $\Delta R2$ remain as they are.

Suppose that both of the MR elements 3A and 3B have the completely same characteristics, that is, letting $R1=R2=R$ and $\Delta R1=-\Delta R2=\Delta R$, Equation (2) is re-expressed as follows:

$$V0 = I0 \times (R1 + \Delta R1 - R2 - \Delta R2) \quad (3)$$
$$= I0 \times (R + \Delta R - R + \Delta R)$$
$$= I0 \times (2\Delta R)$$

Therefore, if the MR elements 3A and 3B whose relation between an external magnetic field and their resistance variation amounts is already known are used, the intensity of the current magnetic fields HmA and HmB can be measured and the magnitude of current to be detected Im that generates the current magnetic fields HmA and HmB can be estimated. In this case, since sensing is performed using two of the MR elements 3A and 3B, twice as much resistance variation can be obtained as compared with the case where sensing is performed using either one of the MR element 3A or the MR element 3B independently. Thereby, it is advantageous for obtaining more accurate measurement value. Since discrepancies in the characteristics of MR elements and dispersion in the connection resistances, etc. can be reduced compared with a case where sensing is performed by way of configuring a bridge circuit using four MR elements, balance adjustment is made easy even if an MR element with high sensitivity is used. In addition, since the number of the MR elements itself can be reduced, the number of terminals naturally becomes fewer, which is advantageous for space-saving.

In the current sensor 10, the potential V1 detected in the third junction point P3 and the potential V2 detected in the fourth junction point P4 are supplied to the differential amplifier AMP, and the compensating current Id making the difference (potential difference V0) zero is outputted. The compensating current Id from the differential amplifier AMP produces a compensating current magnetic field Hd having a direction opposite to the current magnetic field HmA and HmB by flowing near the MR elements 3A and 3B in the direction opposite to the current to be detected Im, thereby canceling errors caused by dispersion in the connection resistances in the circuit, discrepancies in the mutual characteristics of the MR elements 3A and 3B, deviation of temperature distribution, or the disturbance magnetic fields from the outside, etc. As a result, it is possible to get closer to an intensity which is proportional only to the current magnetic fields HmA and HmB. Therefore, by measuring an output voltage Vout and computing the value of the compensating current Id in view of the relation with the known resistor RL in the compensating current detector S, the value of the current magnetic fields HmA and HmB can be calculated with more precision and the magnitude of the current Im to be detected can be estimated with high precision as a result.

Next, the method of manufacturing the current sensor 10 will be explained with reference to FIGS. 5 through 8.

Figure 5:
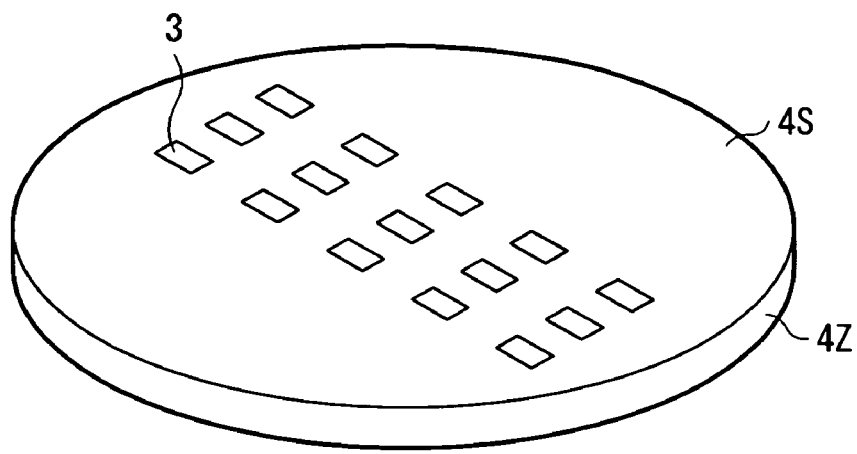
FIG. 5 is a perspective view for explaining a step of a manufacturing method of the current sensor appearing in FIG. 1.
Figure 6:
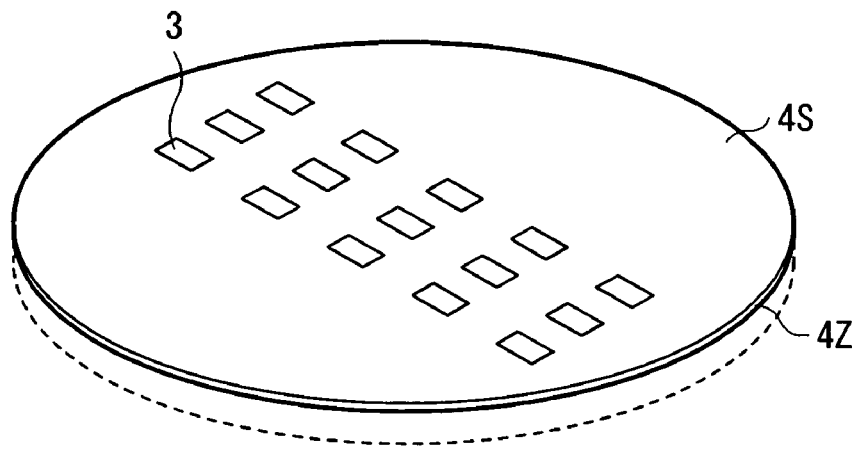
FIG. 6 is a perspective view indicative of a next step following FIG. 5.
Figure 7:
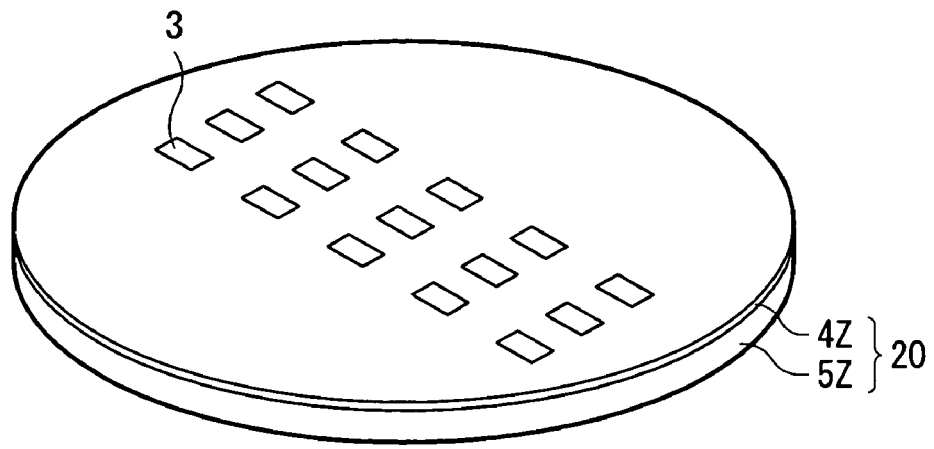
FIG. 7 is a perspective view indicative of a next step following FIG. 6.
Figure 8:
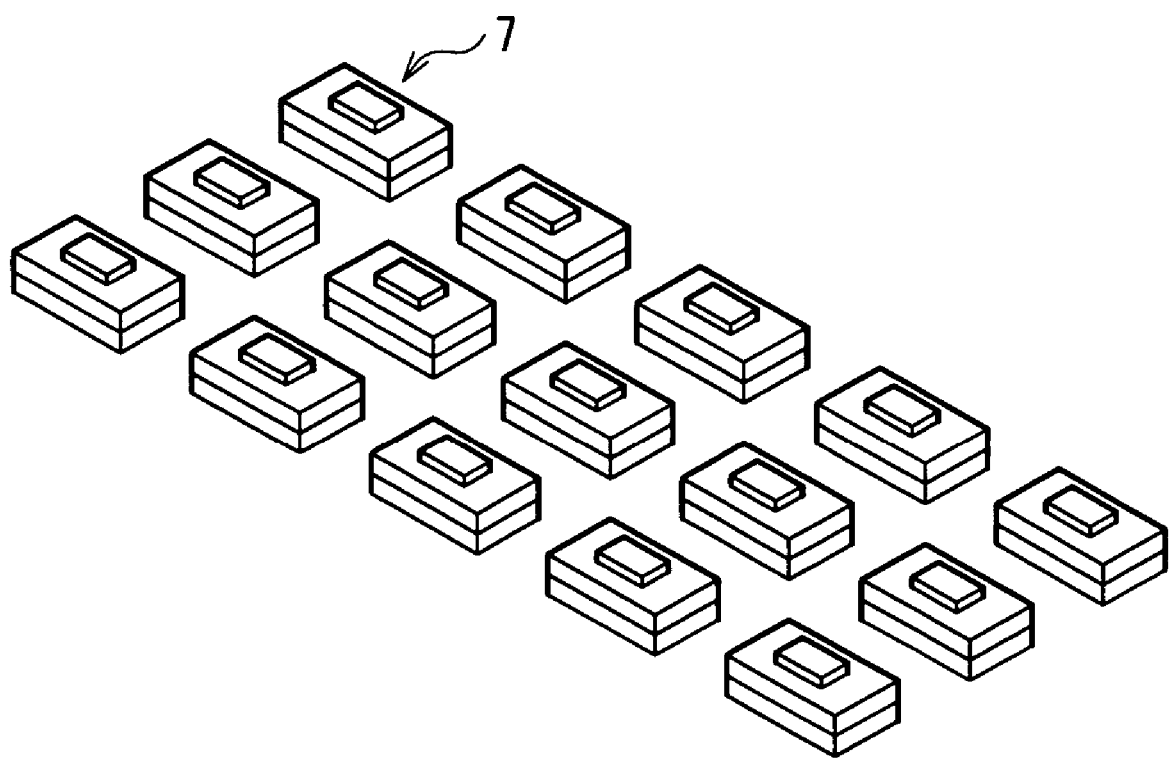
FIG. 8 is a perspective view indicative of a next step following FIG. 7.

Here, first, as shown in FIG. 5, a plurality of MR elements 3 are formed on a face 4S of a substrate 4Z (such as a silicon wafer, etc.) which has a thickness of the order of 2 mm. The back of the substrate 4Z is then ground until it becomes a thickness of, for example 100 μm as shown in FIG. 6. Then a magnetic sheet 5Z is stuck on the back of the substrate 4Z by applying adhesives thereto, for forming a laminated product 20 (FIG. 7). The magnetization direction of the magnetic sheet 5Z is set (magnetizing) under room temperature and then the magnetic field intensity applied to the MR elements 3 is adjusted by grinding the back of the magnetic sheet 5Z as necessary. Subsequently, as shown in FIG. 8, a plurality of magnetic sensors 7 are formed by cutting the laminated product 20 to divide into pieces so that each piece includes an MR element 3. Finally, two magnetic sensors 7 are mounted on a circuit board 8 and then arranged them in the position corresponding to the straight-line portions 2A and 2B of the conductor 2, thereby completing the current sensor 10 by using predetermined steps as described above.

As explained above, according to the current sensor 10 of the present embodiment, the MR elements 3A and 3B and magnetic sheets 6A and 6B, which is disposed along with the conductor line 2 used as the path of the current to be detected Im, are bonded with the substrates 4A and 4B in between so that the magnetic sheets 6A and 6B apply the bias magnetic fields Hb1 and Hb2. As a result, sufficient stabilization can be attained in the detecting operation while using a space in a more effective way, compared with a case where permanent magnets or coils are arranged on both sides of an MR element. Namely, since the magnetic sheets 6A and 6B can be arranged in a nearer position to each of the MR elements 3A and 3B, even with a relatively small dimension made of the same materials, bias magnetic fields Hb1 and Hb2 can be secured sufficiently for a stable detecting operation. What is more, in addition to the advantage that bulk formation is easy because of the simple configuration, even if the directions of the magnetization directions J11A and J11B in the MR elements 3A and 3B are not equal to each other, the bias magnetic field Hb1 and Hb2 can be easily applied to a suitable direction respectively corresponding to each of the magnetization directions J11A and J11B.

In addition, the magnetic sheets 6A and 6B are set in such a way as applying the bias magnetic fields Hb1 and Hb2 in the same direction as the magnetization directions J13A and J13B under no external magnetic field H to the MR elements 3A and 3B. In this manner, uniaxial anisotropy of the free layer 13 is increased, and the stabilization of magnetic field detecting operation in the MR elements 3A and 3B can be efficiently attained. Here, since shape anisotropy is not used, the shape of the MR elements 3A and 3B can be decided in more flexible way, and since they do not have to be divided into two or more pieces, a compact configuration can be realized.

Further, since the V-shaped conductor line 2 including the straight-line portions 2A and the straight-line portion 2B which are orthogonal to each other is employed, a more compact whole configuration can be realized compared with a case where the U-shaped conductor line including a pair of parallel straight-line portions is used.

Thus, according to the current sensor 10 of the present embodiment, measurement of the current to be detected Im can be performed with high precision and full stability while realizing a more compact configuration.

In addition, the current sensor 10 includes: the MR elements 3A and 3B disposed along with the conductor line 2 while mutually connected in parallel so that the resistances R1 and R2 can show mutually opposite directional changes by the current magnetic fields HmA and HmB generated by the current to be detected Im flowing through the conductor line 2; the constant current source CG1 connected in series to the MR element 3A in the third junction point P3; and the constant current source CG2 connected in series to the MR element 3B in the fourth junction point P4, while the constant current source CG1 and the constant current source CG2 are connected in the second junction point P2, and the current to be detected Im is detected based on the potential difference V0 between the third junction point P3 and the fourth junction point P4 produced when voltage is applied between the first junction point P1 and the second junction point P2. In this way, the adjustment of an offset value in a zero-magnetic field can become more simple than a case where four magnetoresistive elements are used, and sensitivity of the MR elements 3A and 3B to be used can become higher. Further, a stabilized current can be supplied equally to both of the MR elements 3A and 3B. Therefore, even if the current to be detected Im is weak, its current magnetic fields HmA and HmB can be detected with high sensitivity and high precision. It is to be noted that a balance adjustment including the MR elements 3A and 3B is needed because of the existence of the constant current sources CG1 and CG2. However, since it is electrically controllable, the balance adjustment in the foregoing case is easier than a case where four magnetoresistive elements are used.

In particular, the current sensor 10 further has the compensating current line C to which the compensating current Id is supplied based on a difference (difference in the voltage drops produced in each of the MR elements 3A and 3B) V0 between the potential V1 detected in the third junction point P3 and the potential V2 detected in the fourth junction point P4 so that the compensating current Id applies the compensating current magnetic fields Hd having a direction opposite to the current magnetic fields HmA and HmB to the MR elements 3A and 3B, respectively. In this way, changes of the output voltage Vout caused by the discrepancies of the characteristics of the MR element 3A and 3B, dispersion of the connection resistances in the circuit or temperature distribution, etc. can be cancelled, and detection of the current magnetic fields HmA and HmB can be attained with higher sensitivity and higher precision.

In addition, the MR elements 3A and 3B, the constant current sources CG1 and CG2, and the compensating current line C are provided so as to be axisymmetrically arranged with respect to the central line CL in the current sensor 10, while the pair of straight-line portions 2A and 2B in the conductor line 2 are arranged axisymmetrically with respect to the central line CL in a plane parallel to the plane including the MR elements 3A and 3B. In this manner, the temperature distribution thereof can become symmetrical with respect to the central line CL. Therefore, the zero-point drift depending on the temperature distribution can be controlled.

<Modification 1>

Herein, a modification of the current sensor according to the present embodiment is explained with reference to FIG. 9.

As shown in FIGS. 4A and B, the current sensor according to the foregoing first embodiment is configured so that the magnetization directions J13A and J13B of the free layer 13 are orthogonal to the magnetization directions J11A and J11B of the pinned layer 11 when no external magnetic field H is applied. However in the present invention, as shown in the modifications shown in FIGS. 9A and 9B, the current sensor may also be configured in such a way that magnetization directions J13A0 and J13B0 of the free layer 13 are parallel to the magnetization directions J11A and J11B of the pinned layer 11, respectively when no external magnetic field H is applied. Specifically, in FIG. 9A, the magnetization direction J11A and the magnetization direction J13A0 of the MR element 3A are both in the +X3 direction orthogonal to the synthetic magnetic field Hm1, and the magnetization direction J11B and the magnetization direction J13B0 of the MR element 3B are both in the +Y3 direction orthogonal to the synthetic magnetic field Hm2. In FIG. 9B, the magnetization direction J11A and the magnetization direction J13A0 of the MR element 3A are both in the +X3 direction orthogonal to the synthetic magnetic field Hm1, and the magnetization direction J11B and the magnetization direction J13B0 of the MR element 3B are both in the −Y3 direction orthogonal to the synthetic magnetic field Hm2. However, in these cases, it is preferable that the bias magnetic fields Hb1 and Hb2 are applied in an oblique direction to the magnetization directions J11A and J11B. Namely, it is desirable to apply the bias magnetic fields Hb1 and Hb2 which have both of a parallel component parallel to the magnetization directions J11A and J11B and a perpendicular component orthogonal to each of the parallel components. Specifically, as for FIG. 9 A, it is preferred that a bias magnetic field Hb1 having the −Y3 direction is applied to the MR element 3A, and a bias magnetic field Hb2 having the +Y2 direction is applied to the MR element 3B. As for FIG. 9B, it is preferred that a bias magnetic field Hb1 having the −Y3 direction is applied to the MR element 3A, and a bias magnetic field Hb2 having the +X3 direction is applied to the MR element 3B. Herein, the parallel components of the bias magnetic fields Hb1 and Hb2, corresponding to an anisotropic magnetic field, increase the uniaxial anisotropy of the free layers 13 as described in the foregoing first embodiment, consequently contributing to stabilization of the magnetic field detecting operation in the MR elements 3A and 3B. On the other hand, the perpendicular components orthogonal to the parallel components are needed because of the following reasons.

Figure 10:
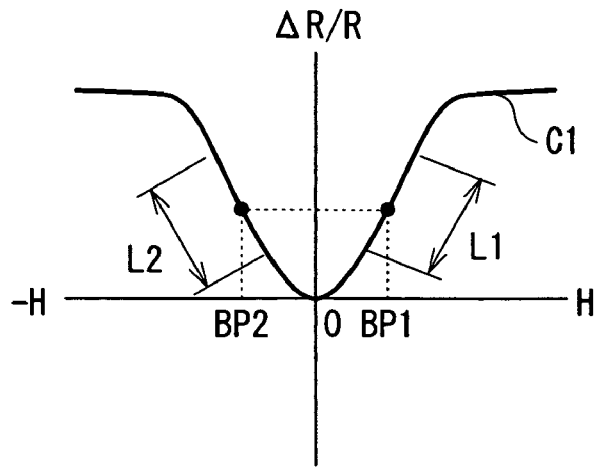
FIG. 10 is a characteristic diagram showing the dependency of a resistance change ratio on a magnetic field in the modification as shown in FIGS. 9A and 9B.

If the external magnetic field H is applied in the direction orthogonal to the magnetization directions J11A and J11B respectively to the magnetoresistive elements 3A and 3B that are set so that the magnetization directions J13A0, J13B0 and the magnetization directions J11A and J11B are mutually parallel in an unloaded state characteristic as shown in FIG. 10 will be obtained. FIG. 10 shows a relation between the external magnetic field H and a resistance change ratio ΔR/R letting the external magnetic field H in the +Y direction be a positive external magnetic field H. As shown herein, the relation therebetween is expressed by one curve C1 in which the value becomes the minimum (ΔR/R=0) when the external magnetic field H=0 and which hardly shows hysteresis. In this case, since 1/f noise caused by hysteresis is extremely small, highly-sensitive and stable sensing can be realized. However, as is clear from FIG. 10, a linear variation is not obtained around no external magnetic field H (H=0). For this reason, bias magnetic fields Hb1 and Hb2 having a perpendicular component orthogonal to the magnetization directions J11A and J11B are applied to the MR elements 3A and 3B in actually measuring the current magnetic fields HmA and HmB so that the magnetization directions J13A0 and J13B0 may be rotated, for example, by 45 degrees to become magnetization directions J13A1 and J13B1 (FIGS. 9A and 9B). In this manner, variation of the current magnetic fields HmA and HmB is detectable with sufficient precision in the linear areas L1 and L2 including bias points BP1 and BP2 as their midpoints, as indicated in FIG. 10.

It is to be noted that in the present modification, by applying the bias magnetic fields Hb1 and Hb2 in suitable directions, resistance R1 of the MR element 3A and resistance R2 of the MR element 3B shows a mutually opposite variation when current magnetic fields HmA and HmB is generated. Therefore, current to be detected Im can be measured by supplying a constant current of a mutually equal value to the MR elements 3A and 3B, and by detecting the difference in voltage drops produced in the MR elements 3A and 3B by the constant current.

Second Embodiment

A current sensor as a second embodiment according to the present invention will be explained next. Although in the foregoing first embodiment is explained the case in which the conductor line 2 of V-shaped configuration in plan view is used, in the present embodiment is explained a case in which a straight-line shaped conductor line 21 is employed.

Figure 11A:
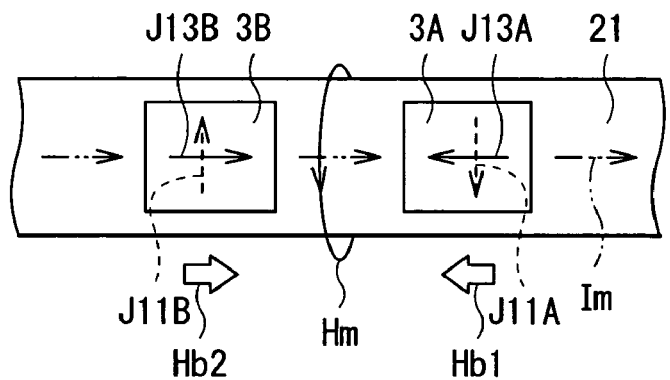
FIGS. 11A and 11B are conceptual diagrams for explaining a state of magnetization directions, current magnetic fields and bias magnetic fields in a current sensor according to a second embodiment of the present invention.
Figure 11B:
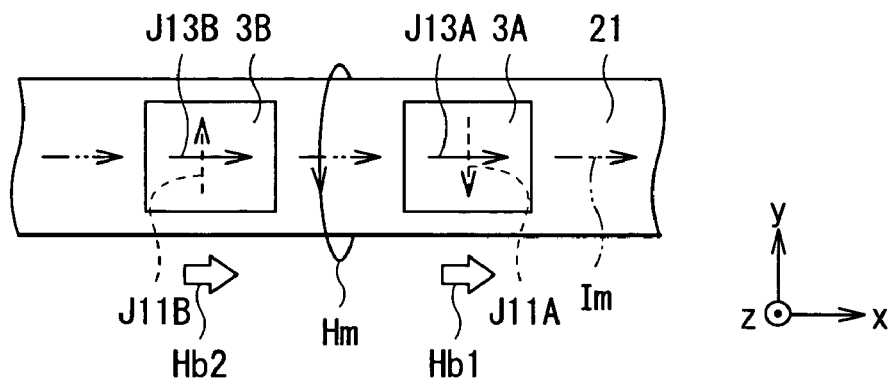

Since the current sensor of the present embodiment has the same configuration as that of the above-mentioned first embodiment substantially except for the conductor line 21, here is explained the relation among the magnetization directions J11 and J13 of the GMR films in the MR elements 3A and 3B, the bias magnetic field Hb, and the current magnetic field Hm with reference to FIGS. 11A and 11B. FIGS. 11A and 11B are conceptual diagrams about the relation among the current direction, the magnetic field direction, and the magnetization direction according to the current sensor of the present embodiment. Here, a current to be detected Im is flowing along the extending direction of the conductor line 21 and the magnetization directions J11 of the pinned layers 11 are pinned in the direction orthogonal to the current to be detected Im, respectively. On the other hand, the magnetization directions J13 of the free layers 13 are either parallel or antiparallel to the flowing direction of the current to be detected Im when no external magnetic field H is applied. Namely, when no external magnetic field H is applied, the magnetization directions J13 of the free layers 13 are orthogonal to the magnetization directions J11 of the pinned layers 11. Therefore, when the current magnetic fields Hm is generated, the magnetization directions J13 come near to a parallel state (low resistance) or antiparallel state (high resistance) with respect to the magnetization directions J11. Here, the MR element 3A and MR element 3B are set so that their resistances R1 and R2 develop an opposite-directional variation each other according to the current magnetic field Hm. Specifically, as shown in FIG. 11A, the MR element 3A has the magnetization direction J11A in the −y direction and the magnetization direction J13A in the −x direction when no external magnetic field H is applied for example. On the other hand, the MR element 3B has the magnetization direction J11B in the +y direction and the magnetization direction J13B in the +x direction when no external magnetic field H is applied. In this case, when the current to be detected Im flows as indicated by arrows to generate the current magnetic field Hm, the magnetization direction J13A is rotated counterclockwise (on the drawing sheet) to be parallel to the magnetization direction J11A, while the magnetization direction J13B is rotated clockwise (on the drawing sheet) to be antiparallel to the magnetization direction J11B. Or as shown in FIG. 11B, the magnetization direction J11A may be in the −y direction while the magnetization direction J13A when no external magnetic field H is applied may be in the +x direction in the MR element 3A, while the magnetization direction J11B may be in the +y direction and the magnetization direction J13B when no external magnetic field H is applied may be in the +x direction. In this case, when current to be detected Im flows in the direction of arrows to generate the current magnetic field Hm, the magnetization direction J13A is rotated clockwise to come to a state parallel to the magnetization direction J11A, while the magnetization direction J13B is rotated clockwise to come to a state of antiparallel to the magnetization direction J11B.

In any case, the bias magnetic fields Hb1 and Hb2 are set so as to be in the same direction with the magnetization directions J13A and J13B when no external magnetic field H is applied, respectively. Therefore, the bias magnetic fields Hb1 and Hb2 increase the uniaxial anisotropy of the free layer 13 as corresponding to an anisotropic magnetic field, consequently contributing to stabilization of the magnetic field detecting operation in the MR elements 3A and 3B. In particular, since the current sensor of the present embodiment employs the straight-line conductor line 21, the current magnetic field Hm of a generally uniformed quality can be generated without producing an interaction like in the case of the U-shaped or V-shaped conductor lines. For this reason, the current magnetic field Hm extends efficiently to the MR elements 3A and 3B, and current measurement can be made with higher precision. If the magnetization directions J11A and J11B are arranged so as to be orthogonal to the flowing direction of the current to be detected Im (namely, the extending direction of the conductor line 21), the highest sensitivity measurement can be attained. Therefore, when the V-shaped conductor line 2 is used (the first embodiment), the magnetic sensors 7A and 7B are leaned along to the extending direction of the conductor line 2 but it is not necessary in the present embodiment, and the magnetic sensors 7A and 7B can be installed simply.

Further, in the current sensor of the present embodiment, since the conductor line 21 has a straight-line configuration, two-dimensional spread can be prevented compared with the above-mentioned first embodiment using the V-shaped conductor line 2, the whole configuration can be made more compact. However, since the magnetization direction J11A and the magnetization direction J11B are in antiparallel mutually as is clear from FIGS. 11A and 11B, the interval between the MR element 3A and the MR element 3B is needed to be larger than the interval W3 shown in FIGS. 4A and 4B in order to avoid interaction of the bias magnetic field Hb1 and the bias magnetic field Hb2.

As described above, according to the present embodiment, since the conductor line 21 of straight-line configuration in plan view is employed and the element substrates 5A and 5B including the MR elements 3A and 3B are disposed along with the conductor line 21, the interval between the MR elements 3A and 3B can be made smaller than the case of the U-shaped conductor line while capable of maintaining the dimension of the MR elements 3A and 3B as they are. Further, since the straight-line conductor line has no turning portion unlike the U-shaped conductor line, the dimension of the conductor line 21 can be made smaller. Therefore, a more compact whole configuration can be realized while maintaining the dimensions of the MR elements 3A and 3B. What is more, the error of measurement based on temperature difference between the MR elements 3A and 3B can be reduced, and current measurement with sufficient precision and stability can be realized.

<Modification 2>

Figure 12A:
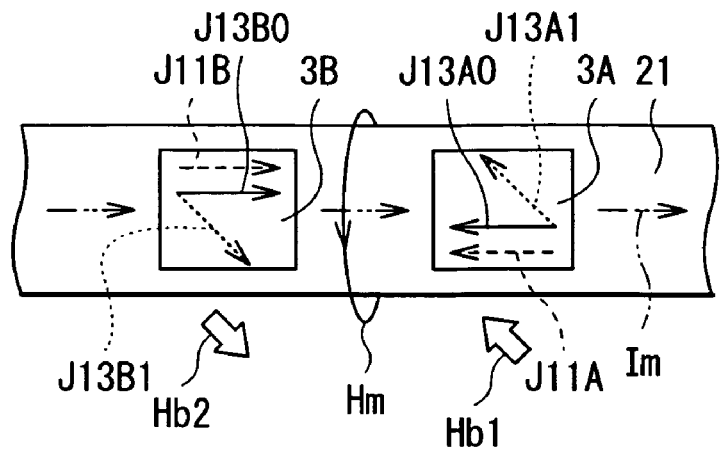
FIGS. 12A and 12B are conceptual diagrams for explaining a state of magnetization directions, current magnetic fields and bias magnetic fields in a modification of the current sensor appearing in FIGS. 11A and 11B.
Figure 12B:
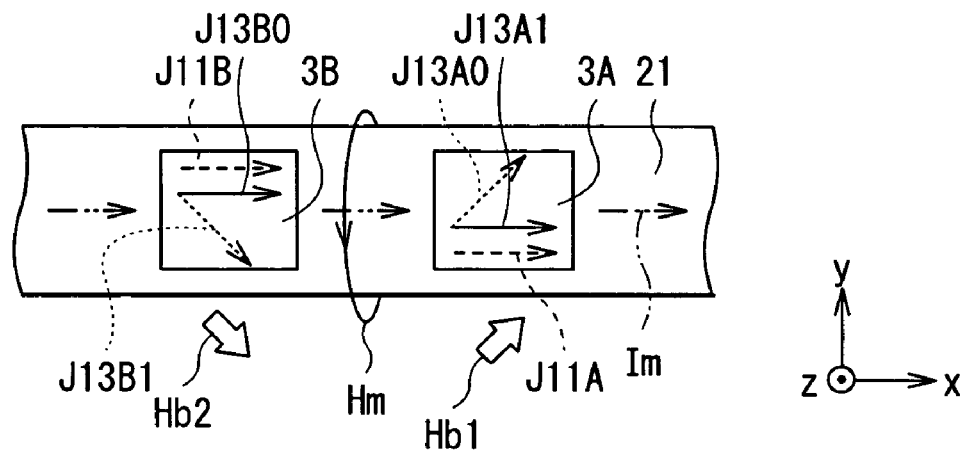

Subsequently, a modification in the current sensor of the present embodiment will be explained with reference to FIGS. 12A and 12B. According to the above-mentioned second embodiment, as shown in FIGS. 11A and 11B, the current sensor is configured in such a way that the magnetization directions J13A and J13B of the free layers 13 and the magnetization directions J11A and J11B of the pinned layers 11 are orthogonal to each other when no external magnetic field H is applied. However, like the modification shown in FIGS. 12A and 12B, the current sensor may be configured in such a way that the magnetization directions J13A0, J13B0 of the free layers 13 and the magnetization directions J11A and J11B of the pinned layers 11 are parallel to each other when no external magnetic field H is applied. Specifically, as shown in FIG. 12A, the magnetization direction J11A and the magnetization direction J13A0 of the MR element 3A are both in the −x direction orthogonal to the current magnetic field Hm, and the magnetization direction J11B and the magnetization direction J13B0 of the MR element 3B are both in the +x direction orthogonal to the current magnetic field Hm. In FIG. 12B, all of the magnetization direction J11A and the magnetization direction J13A0 of the MR element 3A and the magnetization direction J11B and the magnetization direction J13B0 of the MR element 3B are in the +x direction. However, in these cases, it is desirable to apply the bias magnetic fields Hb1 and Hb2 in an oblique direction to the magnetization directions J11A and J11B. Namely, it is desirable to apply the bias magnetic fields Hb1 and Hb2 having both of a parallel component parallel to the magnetization directions J11A or J11B and a perpendicular component orthogonal to each of the parallel components. In this manner, the free layers 13 come to develop magnetization directions J13A1 and J13B1 inclined at 45 degrees to the magnetization directions J11A and J11B, for example. As a result, variation of the current magnetic fields Hm is detectable with sufficient precision in the linear areas L1 and L2 including the bias points BP1 and BP2 as their midpoints, as shown in FIG. 10.

Third Embodiment

Next, a current sensor as a third embodiment according to the present invention will be explained. In the first embodiment as described above is explained the case of arranging the two MR elements 3A and 3B on the straight-line portions 2A and 2B of the conductor line 2. On the other hand, in the present embodiment, four MR elements 3A-3D are arranged on one conductor line 2. Explanation will be made hereinbelow with reference to FIG. 13. Since its configuration is substantially similar to that of the above-mentioned first embodiment except for the point that the four MR elements 3A-3D are arranged, descriptions will be omitted suitably according to circumstances.

Figure 13:
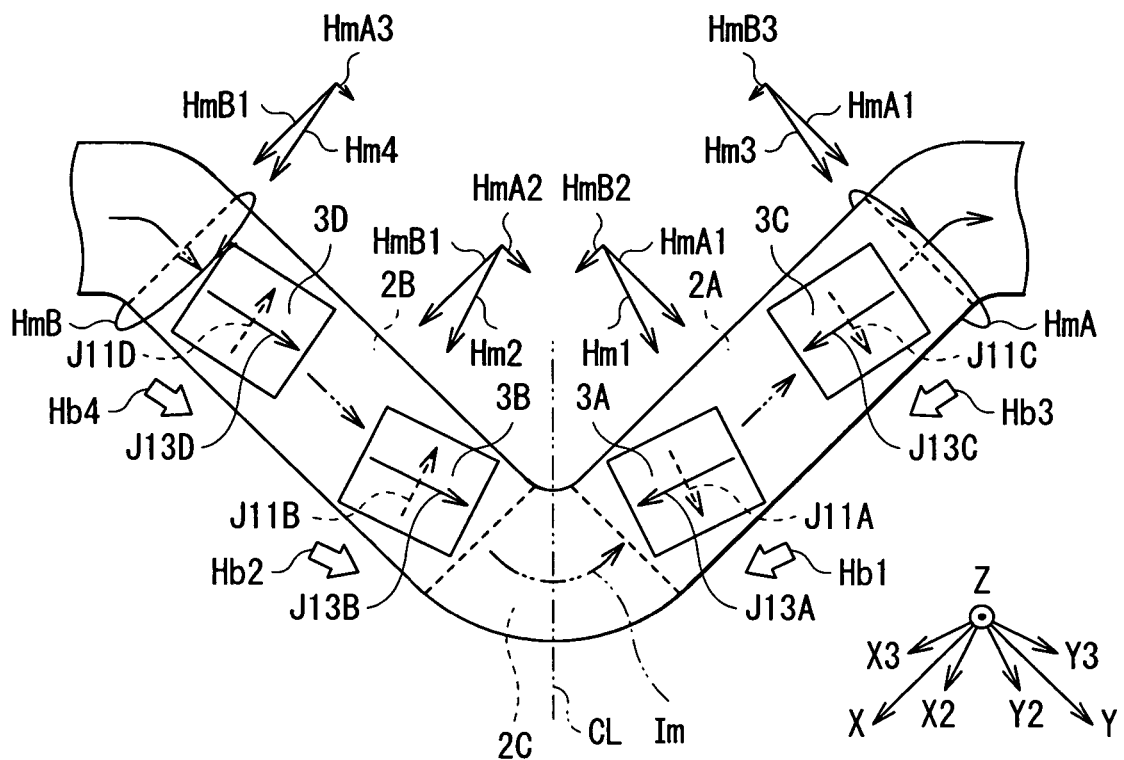
FIG. 13 is a conceptual diagram for explaining a state of magnetization directions, current magnetic fields and bias magnetic fields in a current sensor according to a third embodiment of the present invention.

FIG. 13 is a conceptual diagram showing the relation among the current direction, magnetic field direction, and magnetization direction of the current sensor according to the present embodiment. As shown in FIG. 13, in the current sensor of the present embodiment, the straight-line portion 2A is provided with the MR element 3A and the MR element 3C along with the extending direction of the straight-line portion 2A (in the x-axis direction). On the other hand, the straight-line portion 2B is provided with the MR element 3B and the MR element 3D along with the extending direction of the straight-line portion 2B (in the y-axis direction). It is to be noted that each of the MR elements 3A-3D is disposed on a substrate (not shown) respectively to form an element substrate. Further, a magnetic sheet (not shown) is provided between the substrate and the conductor line 2 so as to apply bias magnetic fields Hb1-Hb4 to the MR elements 3A-3D, respectively.

For example, supposing a current to be detected Im flows along the extending direction of the conductor line 2 as shown by arrows, a current magnetic field HmA is generated around the straight-line portion 2A, and a current magnetic field HmB is generated around the straight-line portion 2B. In this case, as indicated by vectors, a synthetic magnetic field Hm1, which is a resultant force of a magnetic field component HmA1 in the +Y direction caused by the current magnetic field HmA and a magnetic field component HmB2 in the +X direction caused by the current magnetic field HmB, is applied to the MR element 3A. Similarly, a synthetic magnetic field Hm2, which is a resultant force of a magnetic field component HmA2 in the +Y direction caused by the current magnetic field HmA and a magnetic field component HmB1 in the +X direction caused by the current magnetic field HmB, is applied to the MR element 3B. To the MR element 3C, a synthetic magnetic field Hm3, which is a resultant force of the magnetic field component HmA1 in the +Y direction caused by the current magnetic field HmA and a magnetic field component HmB3 in the +X direction caused by the current magnetic field HmB, is applied. To the MR element 3D, a synthetic magnetic field Hm4, which is a resultant force of a magnetic field component HmA3 in the +Y direction caused by the current magnetic field HmA and the magnetic field component HmB1 in the +X direction caused by the current magnetic field HmB, is applied. Here, since the MR elements 3C and 3D are located in the position far from the center position CL compared with the MR elements 3A and 3B, they are less influenced by the interaction of the current magnetic field HmA and the current magnetic field HmB than the MR elements 3A and 3B. Namely, the magnetic field component Hm3 is smaller than the magnetic field component Hm2 (Hm3<Hm2), and the magnetic field component HmA3 is smaller than the magnetic field component HmA2 (HmA3<HmA2). Therefore, the synthetic magnetic field Hm3 has a direction nearer to the +Y direction than the synthetic magnetic field Hm1, and the synthetic magnetic field Hm4 has a direction nearer to the +X direction than the synthetic magnetic field Hm2.

As for the MR elements 3A and 3C, the magnetization directions J11A and J11C of the pinned layers 11 are pinned in a direction so as to be parallel to the synthetic magnetic fields Hm1 and Hm3, respectively. As for the MR elements 3B and 3D, on the other hand, the magnetization directions J11B and J11D of the pinned layers 11 are pinned so as to be antiparallel to the synthetic magnetic fields Hm2 and Hm4, respectively. When no external magnetic field H is applied, the magnetization directions J13A and J13C of the free layer 13 are in a state of slightly tilting in the −Y direction from +X direction so as to be orthogonal to the synthetic magnetic fields Hm1 and Hm3, respectively. The magnetization directions J13B and J13D are in the state of slightly tilting in the −X direction from +Y direction so as to be orthogonal to the synthetic magnetic fields Hm2 and Hm4, respectively. Namely, when no external magnetic field H is applied, the magnetization directions J13A-J13D are in a state of being orthogonal to the magnetization directions J11A-J13D, respectively. Therefore, if a current to be detected Im is supplied to the conductor line 2 to generate the synthetic magnetic fields Hm1-Hm4, the magnetization directions J13A and J13C approach a state of being parallel (low resistance) to the magnetization directions J11A and J11C, respectively, and the magnetization directions J13B and J13D approach a state of being antiparallel (high resistance) to the magnetization directions J11B and J11D, respectively. Therefore, resistances R1 and R3 of the MR elements 3A and 3C are reduced, and resistances R2 and R4 of the MR elements 3B and 3D are increased.

Figure 14:
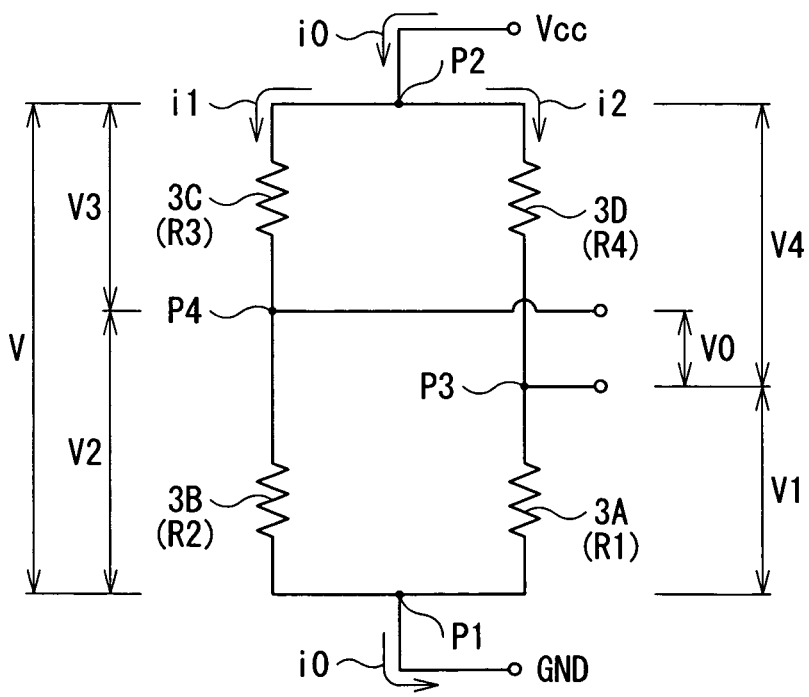
FIG. 14 is a circuit diagram corresponding to the current sensor shown in FIG. 13.

As shown in FIG. 14, in the current sensor of the present embodiment, ends of the MR elements 3A and 3B are connected each other in a first junction point P1, ends of the MR elements 3C and 3D are connected each other in a second junction point P2, the other end of the MR element 3A and the other end of the MR element 3D are connected each other in a third junction point P3, and the other end of the MR element 3B and the other end of the MR element 3C are connected each other in a fourth junction point P4. Consequently, a bridge circuit is configured. It is to be noted that FIG. 14 expresses a circuit configuration in the current sensor of the present embodiment.

Hereafter, a method of measuring the current magnetic fields H1A and HmB generated by the current to be detected Im will be explained with reference to FIG. 14.

In FIG. 14, a state where the external magnetic field H is not applied is considered first. Each resistance of the MR elements 3A-3D in sending a read current i0 is expressed by r1-r4. The read current i0 flowing from a power supply Vcc is split into two, a read current i1 and a read current i2, in the second junction point P2. Then, the read current i1 which passed the MR element 3C and the MR element 3B, and the read current i2 which passed the MR element 3D and the MR element 3A join in the first junction point P1. In this case, potential difference V between the second junction point P2 and the first junction point P1 is expressed as follows:

$$V = i1 \times r3 + i1 \times r2 = i2 \times r4 + i2 \times r1 \quad (4)$$
$$= i1 \times (r3 + r2) = i2 \times (r4 + r1)$$

Potential V3 in the fourth junction point P4 and potential V4 in the third junction point P3 can be expressed as follows:

$$V3 = V - i1 \times r3$$

$$V4 = V - i2 \times r4,$$

Therefore, potential difference V0 of the fourth junction point P4 and the third junction point P3 is expressed as follows:

$$V0 = V4 - V3 \quad (5)$$
$$= (V - i2 \times r4) - (V - i1 \times r3)$$
$$= i1 \times r3 - i2 \times r4$$

Here, it can be rewritten as follows based on the equation (4):

$$V0 = \{r3/(r3 + r2)\} \times V - \{r4/(r4 + r1)\} \times V \quad (6)$$
$$= \{r3/(r3 + r2) - r4/(r4 + r1)\} \times V$$

In this bridge circuit, resistance variation amount can be obtained by measuring the potential difference V0 between the fourth junction point P4 and the third junction point P3 as expressed with the above-mentioned equation (6) when the current magnetic fields HmA and HmB which are an external magnetic field is applied. Here, supposing the resistances R1-R4 are changed by the variation amount of ΔR1-ΔR4, respectively when the current magnetic fields HmA and HmB are applied, that is, letting each of the resistance values R1-R4 after application of the current magnetic fields HmA and HmB be $$R1 = r1 + \Delta R1$$

$$R2 = r2 + \Delta R2$$

$$R3 = r3 + \Delta R3$$

$$R4 = r4 + \Delta R4,$$

the potential difference V0 at the time of the application of the current magnetic fields HmA and HmB can be expressed as follows based on the equation (6):

$$V0 = \{(r3+\Delta R3)/(r3+\Delta R3+r2+\Delta R2) - (r4+\Delta R4)/(r4+\Delta R4+r1+\Delta R1)\} \times V \quad (7)$$

Since the current sensor is configured so as to show a mutually opposite-directional variation between the resistances R1 and R3 of the MR elements 3A and 3C and the resistances R2 and R4 of the MR elements 3B and 3D the values of variation ΔR4 and variation ΔR1 cancel each other, and variation ΔR3 and variation ΔR2 cancel each other. For this reason, in comparing values before/after the application of the current magnetic fields HmA and HmB, the denominator values in each term are scarcely increased in the equation (7). On the other hand, as for the numerator value in each term, increase or decrease appears since variation ΔR3 and variation ΔR1 have mutually opposite positive/negative signs without fail.

Supposing that all the MR elements 3A-3D have the same characteristics completely, that is, letting r1=r2=r3=r4=R and ΔR1=-ΔR2=ΔR3=-ΔR4=ΔR, the equation (7) is given as follows:

$$V0 = \{(R+\Delta R)/(2 \times R) - (R \cdot \Delta R)/(2 \times R)\} \times V$$

$$= (\Delta R/R) \times^* V$$

Thus, if the MR elements 3A-3D whose characteristic values, such as ΔR/R, are known are used, the intensity of the current magnetic fields HmA and HmB can be measured and consequently, the magnitude of current to be detected Im generating the current magnetic fields HmA and HmB can be estimated. In particular, since sensing is performed using the four MR elements 3A-3D, measurement with higher precision can be realized compared with a case where sensing is performed using only two MR elements 3A and 3B.

Although the case of using the conductor line 2 of V-shaped configuration in plan view is explained in the present embodiment, the present invention is not limited to this and it is also possible to arrange the four MR elements 3A-3D along with the straight-line shaped conductor line 21 explained in the second embodiment for example.

EXAMPLE

Next, an example of the present invention will be explained hereinbelow.

Figure 15:
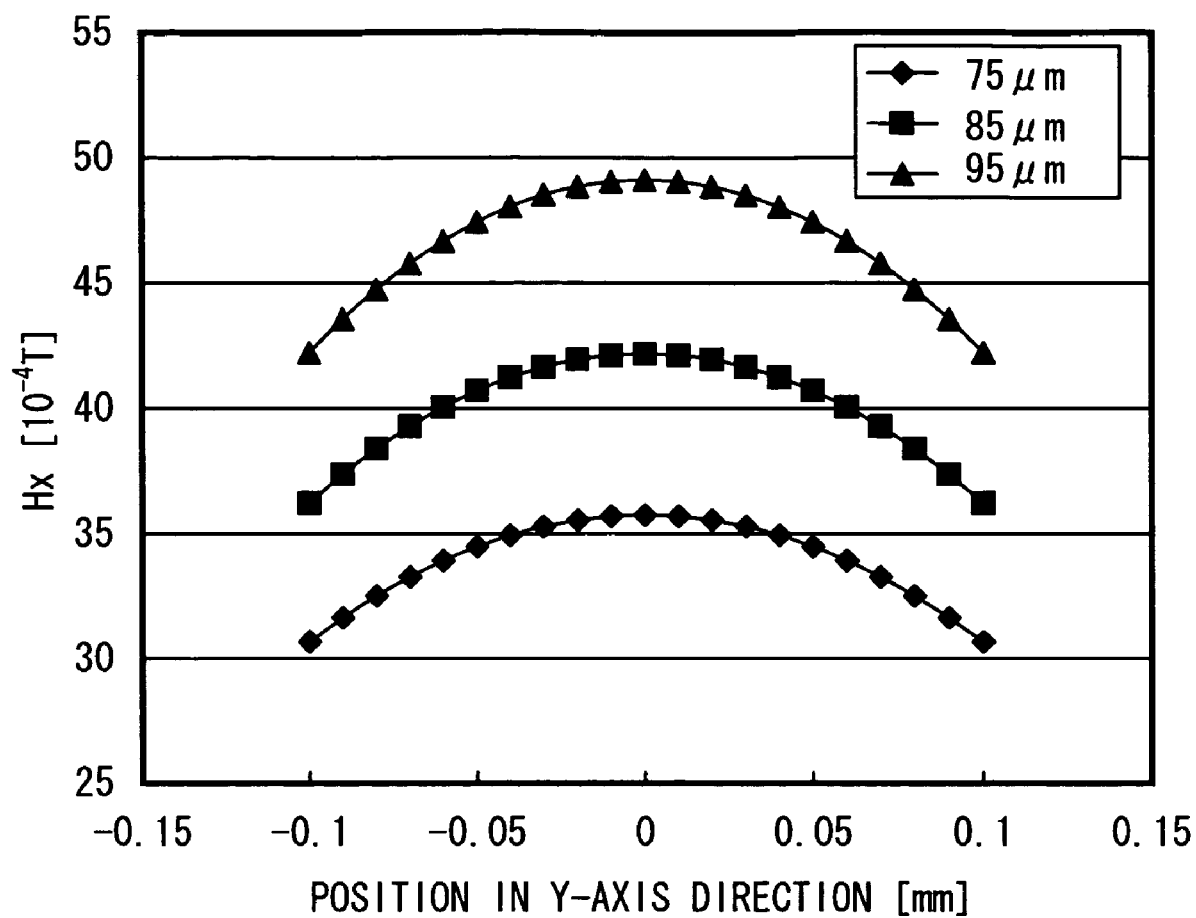
FIG. 15 is a characteristic diagram indicating a distribution of bias magnetic fields Hx in a magnetic sheet of the current sensor shown in FIGS. 9A and 9B.
Figure 16:
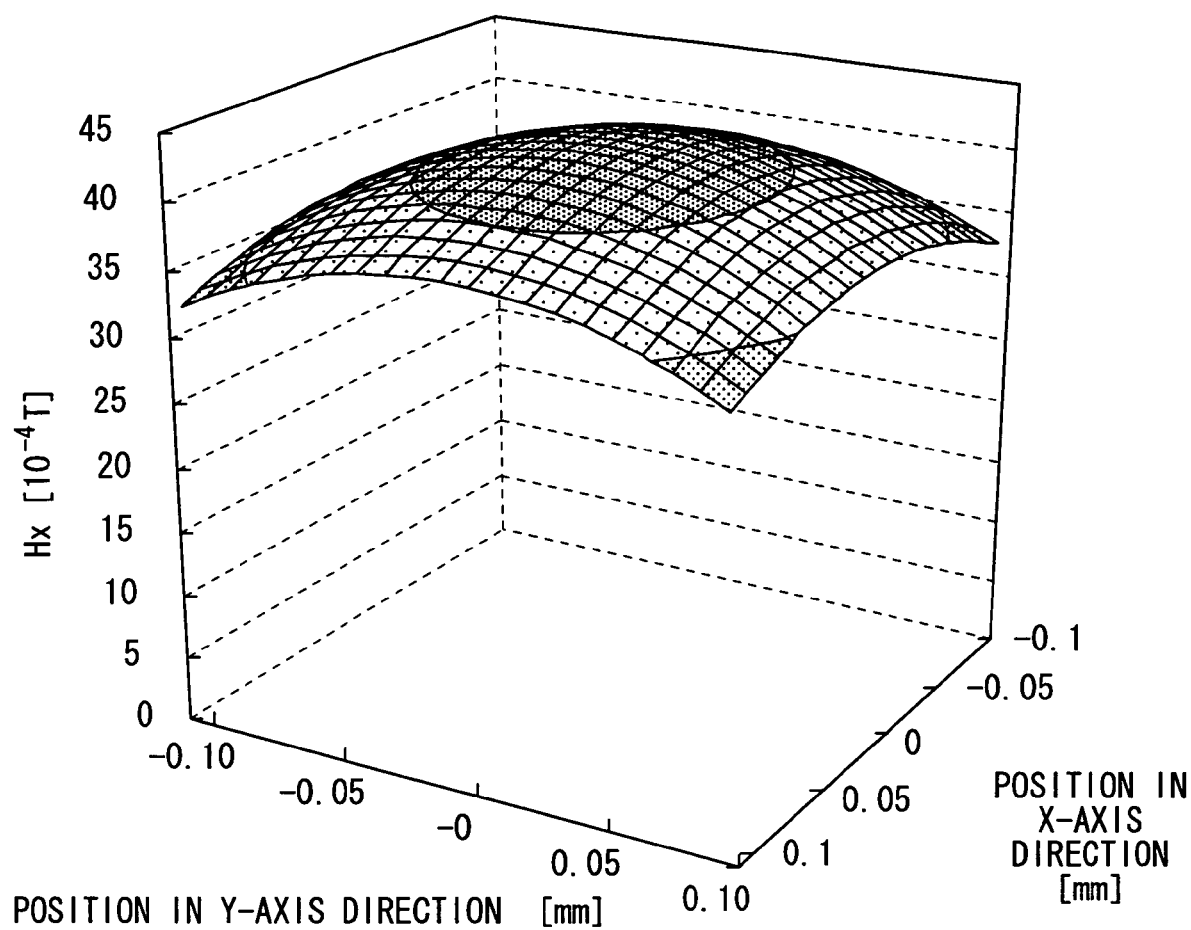
FIG. 16 is another characteristic diagram indicating a distribution of bias magnetic fields Hx in the magnetic sheet of the current sensor shown in FIGS. 9A and 9B.
Figure 17:
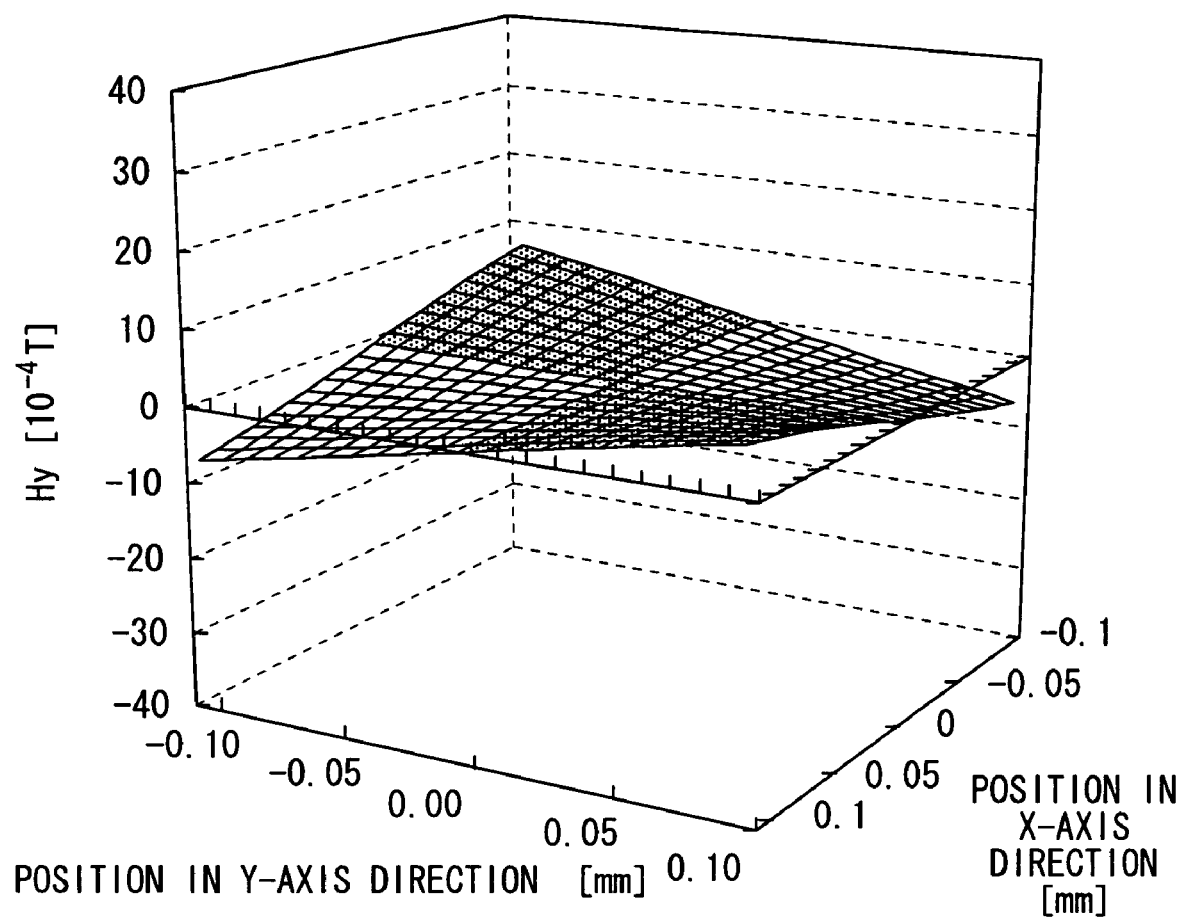
FIG. 17 is a characteristic diagram indicating a distribution of bias magnetic fields Hy in the magnetic sheet of the current sensor appearing in FIGS. 9A and 9B.

In the present example, a sample was produced corresponding to the MR element 3B in the above-mentioned second embodiment (FIGS. 11A and 11B), and distribution of the bias magnetic field produced by the magnetic sheet was investigated with regard to the sample. Herein, based on a micromagnetics simulation, a bias magnetic field Hx as a magnetic field component in the x-axis direction orthogonal to the magnetization direction of the pinned layer, and a bias magnetic field Hy as a magnetic field component in the y-axis direction parallel to the magnetization direction of the pinned layer were respectively calculated on the basis of the magnetic sheet face. The result is shown in FIGS. 15-17. It is to be noted that the magnetic sheet was magnetized in the x-axis direction to have a function of securing the operation stability of the MR elements by applying the bias magnetic field in the direction of x (orthogonal to the magnetization direction of the pinned layer) to the MR elements. The simulation was performed under the condition that the x directional dimension of the magnetic sheet was 0.37 mm and the y directional dimension of the magnetic sheet was 0.26 mm. Only an area of 0.2 mm (in the x-axis direction)×0.2 mm (in the y-axis direction) including the center positions thereof is shown in FIGS. 15-17.

FIG. 15 shows a distribution of the bias magnetic field Hx in the y-axis direction. Here, the horizontal coordinate represents positions (mm) in the y-axis direction passing through the center position of the magnetic sheet, and the vertical coordinate expresses the bias magnetic field Hx. Here, three thickness levels of magnetic sheets (75 μm, 85 μm, and 95 μm) were prepared. As shown in FIG. 15, every thickness level shows a similar distribution state of gentle convex shape having the center position 0 as its peak for indicating the intensity of the bias magnetic field Hx. It was also confirmed that the intensity of the bias magnetic field Hx could be increased by enlarging the thickness, and the intensity of the bias magnetic field Hx could be reduced by reducing the thickness.

FIG. 16 is a characteristic diagram showing a distribution of bias magnetic field Hx developed by the magnetic sheet which has a thickness of 85 μm, in the y-directional positions (mm) and in the x-directional positions (mm). In FIG. 16, the center position in each of the x axis and the y axis was set to the origin (zero point). As shown in FIG. 16, the distribution of the bias magnetic field Hx was a shape of curved surface within a range from $32 \times 10^{-4}$ [T] to $43 \times 10^{-4}$ [T], in which the cross-point of each of the center positions (namely, the zero points) in both of the x-axis direction and the y-axis direction of the magnetic sheet was the apex. Namely, it proved that the biggest bias magnetic field Hx was obtained in the center position of the magnetic sheet.

FIG. 17 shows a distribution of bias magnetic field Hy in the y axis direction and the x axis direction. Here, the center position in each of the x axis and the y axis directions was set as the origin (zero point) similar to the bias magnetic field Hx. Here, in order to secure the operational stability of the MR elements, it is desirable that intensity of the bias magnetic field Hy is zero. As shown in FIG. 17, it proved that the bias magnetic field Hy was zero in the center position of the magnetic sheet, but the absolute value of the bias magnetic field Hy was slightly increasing as going to the periphery. However, the absolute value of the bias magnetic field Hy was a very small value less than $10 \times 10^{-4}$ [T], with which level no practical problem would occur. It is to be noted that in FIG. 17, the bias magnetic field Hy in the positive area (from 0 mm to −0.1 mm) and the bias magnetic field Hy in the negative area (from 0 mm to 0.1 mm) of the x axis direction show the mutually opposite positive/negative signs. The phenomenon means that the bias magnetic field Hy has a mutually opposite direction on both sides of the center position of the x axis on the magnetic sheet. Similarly, the bias magnetic field Hy in the positive area (from 0 mm to −0.1 mm) and the bias magnetic field Hy in the negative area (from 0 mm to 0.1 mm) of the y axis direction show the mutually opposite positive/negative signs. The phenomenon means that the bias magnetic field Hy has a mutually opposite direction on both sides of the center position of the y axis on the magnetic sheet.

As a result of FIGS. 15-17, it proved that a bias magnetic field component (the bias magnetic field Hx) in the originally necessary direction could be applied most efficiently if the MR element was arranged in the center position of the magnetic sheet, and what is more, the influence of the bias magnetic field component (bias magnetic field Hy) in the unnecessary direction could be reduced. It was also confirmed that the bias magnetic field of a desired intensity could be given to the magnetoresistive element by selecting a thickness of the magnetic sheet.

Figure 18:
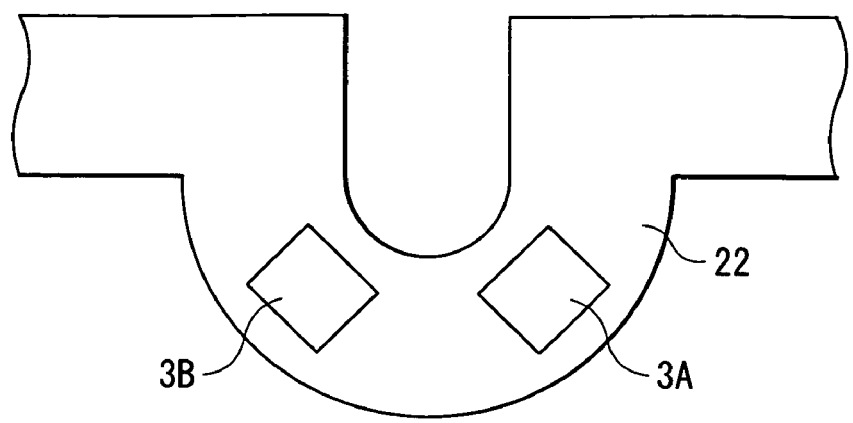
FIG. 18 is a schematic diagram showing a first modification of a conductor used in the current sensor appearing in FIG. 1.
Figure 19:
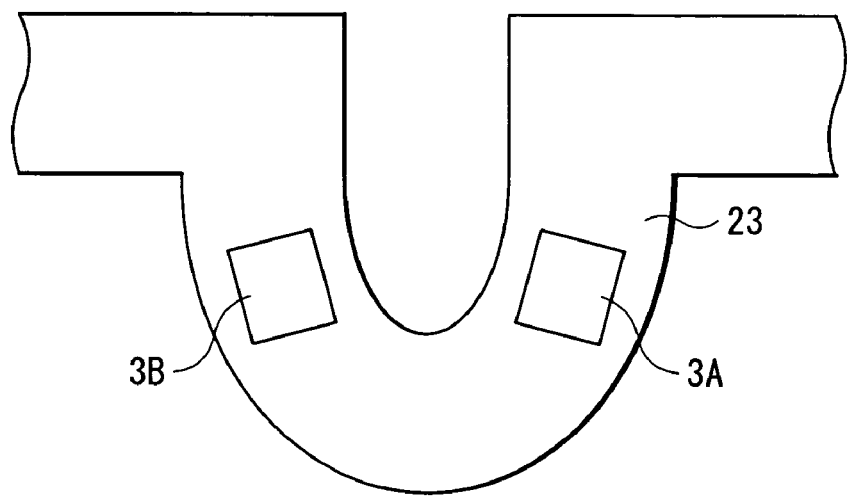
FIG. 19 is a schematic diagram showing a second modification of a conductor used in the current sensor appearing in FIG. 1.
Figure 20:
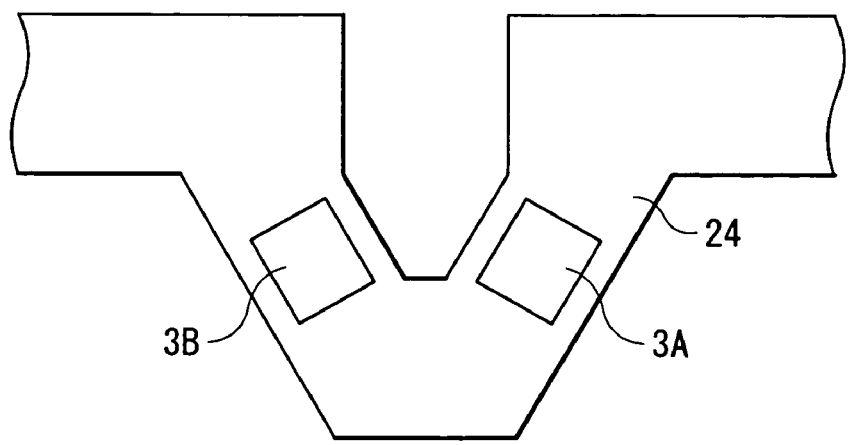
FIG. 20 is a schematic diagram showing a third modification of a conductor used in the current sensor appearing in FIG. 1.

As mentioned above, although the present invention has been explained with reference to some embodiments and modifications, the present invention is not limited to the above-mentioned embodiments etc. and various kinds of modifications are possible. For example, in the above-mentioned embodiments, there is explained a case of V-shaped conductor line having two straight-line portions orthogonal to each other, but V-shaped conductor lines are not limited to this. Namely, if a conductor line having two straight-line portions has a mutual angle of more than zero and less than 180 degrees, the conductor line corresponds to "the V-shaped conductor line" according to the present invention. Further, a conductor line 22 including a semicircle as shown in FIG. 18, and a conductor line 23 including a part of an ellipse as shown in FIG. 19 are also included in the concept of the "V-shaped conductor line" of the present invention. Still more, a conductor line 24 including only of straight-line portions as shown in FIG. 20 is also included in the "V-shaped conductor line" of the present invention.

Obviously, many modifications and variations of the present invention are possible in the light of the above teachings. It is therefore to be understood that within the scope of the appended claims the invention may be practiced otherwise than as specifically described.

What is claimed is:

1. A current sensor of comprising:
    a conductor line generating a current magnetic field according to a supplied current to be detected;
    a pair of element substrates each including a magnetoresistive element disposed along with the conductor line;
    a pair of magnetic sheets each attached on one side of each of the element substrates, respectively, so as to apply a bias magnetic field to each of the magnetoresistive elements;
    a pair of constant current sources each supplying a constant current of a common magnitude to each of the magnetoresistive elements; and
    a difference detector detecting a difference in the voltage drops resulting from the constant current in each of the magnetoresistive elements,
    wherein the magnetoresistive elements in the element substrates are set so that a resistance value of one of the magnetoresistive elements changes in a direction opposite to that of resistance-value-change of the other magnetoresistive element according to the current magnetic field.

2. The current sensor according to claim 1,
    wherein the magnetoresistive element comprises in order:
        a pinned layer having a magnetization direction pinned to a direction;
        an intermediate layer; and
        a free layer whose magnetization direction changes according to an external magnetic field, while the magnetization direction under no external magnetic field is parallel or antiparallel to the direction in which the conductor line is extending.

3. The current sensor according to claim 2,
    wherein the magnetization direction of the pinned layer is orthogonal to the magnetization direction of the free layer when no external magnetic field is applied.

4. The current sensor according to claim 3,
    wherein the magnetic sheet applies a bias magnetic field in the same direction as the magnetization direction of the free layer under no external magnetic field.

5. The current sensor according to claim 2,
    wherein the magnetization direction of the pinned layer is parallel to the magnetization direction of the free layer when no external magnetic field is applied.

6. The current sensor according to claim 5,
    wherein the magnetic sheet applies a bias magnetic field, the bias magnetic field having both a parallel component parallel to the magnetization direction of the pinned layer and a perpendicular component orthogonal to the parallel component.

* * * * *